(12) United States Patent
Kunikiyo

(10) Patent No.: US 6,737,314 B2
(45) Date of Patent: May 18, 2004

(54) SEMICONDUCTOR DEVICE MANUFACTURING METHOD AND SEMICONDUCTOR DEVICE

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/121,711

(22) Filed: Apr. 15, 2002

(65) Prior Publication Data

US 2002/0151134 A1 Oct. 17, 2002

Related U.S. Application Data

(62) Division of application No. 09/476,779, filed on Dec. 30, 1999, now abandoned.

(30) Foreign Application Priority Data

Jul. 22, 1999 (JP) .......................................... P11-207522

(51) Int. Cl.[7] .......................................... H01L 21/8242
(52) U.S. Cl. ........................ 438/241; 438/230; 438/253; 438/639
(58) Field of Search ................................. 438/195, 230, 438/241, 253–256, 303, 299–307, 639, 396–399

(56) References Cited

U.S. PATENT DOCUMENTS 5,296,399 A    3/1994  Park
5,716,861 A  *  2/1998  Moslehi ....................... 438/231
6,051,462 A  *  4/2000  Ohno .......................... 438/241
6,242,781 B1 *  6/2001  Batra et al. .................. 257/380
6,274,426 B1 *  8/2001  Lee et al. ..................... 438/253

FOREIGN PATENT DOCUMENTS

| DE | 41 13 733 | 10/1991 |
| DE | 198 23 464 | 4/1999 |
| JP | 4-251972 | 9/1992 |
| JP | 5-160362 | 6/1993 |
| KR | 92-3523 | 2/1992 |
| KR | 93-9131 | 9/1993 |

* cited by examiner

*Primary Examiner*—Phat X. Cao
*Assistant Examiner*—Theresa T. Doan
(74) *Attorney, Agent, or Firm*—Oblon, Spivak, McClelland, Maier & Neustadt, P.C.

(57) ABSTRACT

A method for manufacturing a semiconductor device in which a MOS transistor having a reduction in a leakage current is obtained without unnecessarily damaging an integration of the transistor. After MOS transistor structures having a first sidewall are formed, an interlayer dielectric film is formed over a whole surface. A silicon nitride film is deposited on the interlayer dielectric film. Next, trenches are formed in only a memory cell region through the interlayer dielectric film and the silicon nitride film, such that a side-face of the sidewall is exposed. Another silicon nitride film is deposited along internal walls of the trenches, and a part of the another silicon nitride film formed along the internal walls of the trenches is then removed by etching. Thus, another sidewall acting as a second sidewall is formed adjacently to the first sidewall in the memory cell region.

3 Claims, 24 Drawing Sheets

F I G. 19
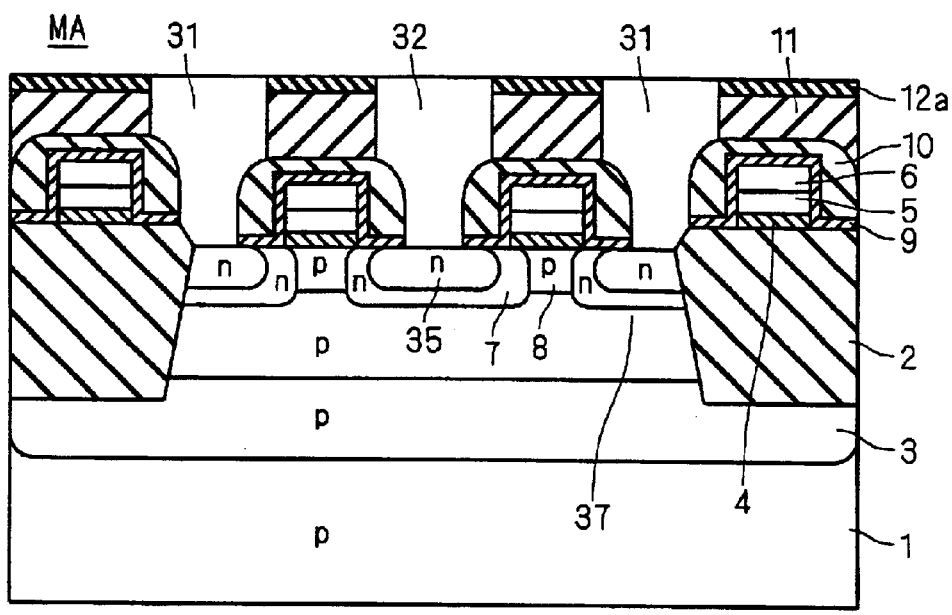
F I G. 20
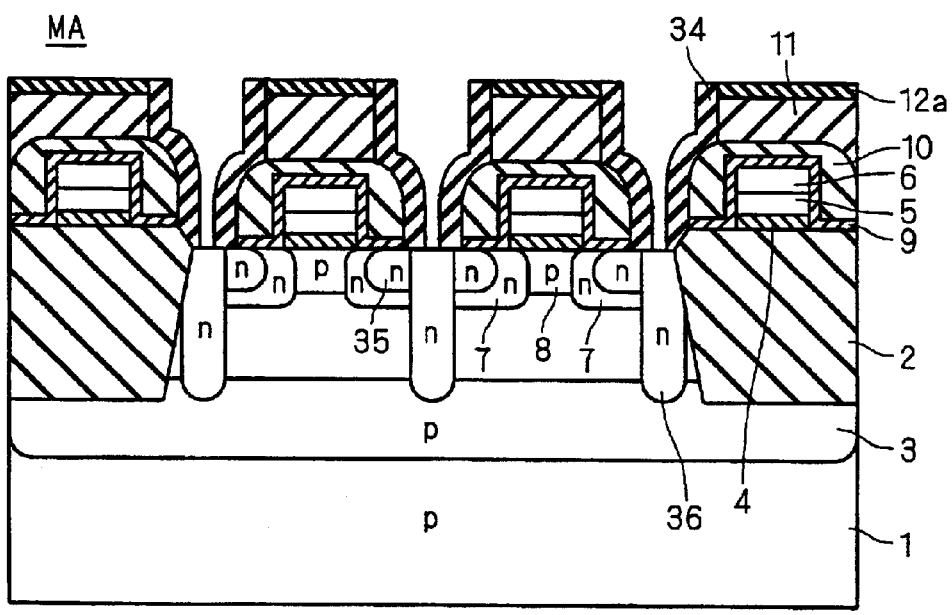

SEMICONDUCTOR DEVICE MANUFACTURING METHOD AND SEMICONDUCTOR DEVICE

BACKGROUND OF THE INVENTION

1. Field of the Invention

The present invention relates to a method for manufacturing a semiconductor device such as a MOS transistor which is to be used for a DRAM (Dynamic Random Access Memory).

2. Description of the Background Art

The DRAM (Dynamic Random Access Memory) is constituted by a memory cell array to act as a storage region for storing memory information and a peripheral circuit portion for causing the memory cell array to perform a predetermined input/output operation. The memory cell array is provided with a plurality of memory cells corresponding to minimum storage units. The memory cell in the DRAM is basically constituted by one capacitor and one MOS (Metal Oxide Semiconductor) transistor connected to the capacitor. In the operation, it is decided whether predetermined electric charges are stored in the capacitor or not. The decision is caused to correspond to data "0" and "1", thereby storing information.

FIG. 34 is a typical equivalent circuit of the memory cell of the DRAM. As shown in FIG. 34, a memory cell 200 comprises a capacitor 201 and a cell transistor 202. One electrode of source/drain electrodes of the cell transistor 202 is connected to one electrode of the capacitor 201, and a bit line 203 is connected to the other electrode of the cell transistor 202. Moreover, a gate-electrode of the cell transistor 202 is connected to a word line 204 and the bit line 203 is connected to a sense amplifier 205.

The expression of "source/drain" is used for the electrode to function as a source for supplying carriers and to fulfill the function of taking out (draining) the carriers by reading or writing information.

FIG. 35 is a sectional view showing a structure of a conventional memory cell. In FIG. 35, a partially hidden part is shown in a broken line. As shown in FIG. 35, an STI (Shallow Trench Isolation) 102 made of an isolation oxide film or the like is formed on a p-type semiconductor substrate 101, thereby electrically insulating elements.

An n-type MOS transistor comprises a gate insulating film 103, a gate-electrode 104, n-type source/drain regions 105 and 106, a sidewall 107 and an insulating film 108. The gate-electrode 104 is also caused to function as the word line 204.

The source/drain regions 105 and 106 are selectively formed on a surface of the semiconductor substrate 101 with the gate-electrode 104 interposed therebetween. The sidewall 107 is an insulating film for covering the gate-electrode 104, and the insulating film 108 is formed under the sidewall 107 adjacent to the gate insulating film 103.

A polysilicon pad 110a has a bottom face connected to the source/drain region 106 and a top face connected to a storage node 111 which will be described below. On the other hand, a polysilicon pad 110b has a bottom face connected to the source/drain region 105 and a top face connected to a bit line 113 shown in a broken line over a region which is not shown in FIG. 35.

An interlayer dielectric film 112 is formed over the whole surface of the semiconductor substrate 101 including the MOS transistor and the polysilicon pads 110a and 110b, and a silicon nitride film 114 is formed above the interlayer dielectric film 112.

A memory cell capacitor 118 is formed in a region on the silicon nitride film 114. The memory cell capacitor 118 is constituted by a lower electrode 115, rough surface polysilicon 120, a capacitor dielectric film 116 and a cell plate 117. The lower electrode 115 is made of a material such as amorphous silicon doped with phosphorus or doped polysilicon. The capacitor dielectric film 116 comprises a silicon oxide film, a silicon nitride film, a high dielectric film and the like. The cell plate 117 is made of polysilicon containing n-type impurities. The lower electrode 115 of the memory cell capacitor 118 is electrically connected to the polysilicon pad 110a through the storage node 111 formed penetrating the interlayer dielectric film 112.

Electric charges stored as memory information in the memory cell capacitor 118 are gradually discharged by a leakage current in an n-p junction portion of the source/drain regions 105 and 106 and the semiconductor substrate 101, the capacitor dielectric film 116 or the like. Therefore, it is necessary to perform an operation for timely injecting electric charges in order to continuously hold the storage in a DRAM. This operation is referred to as refresh.

The refresh operation will briefly be described below. First of all, the contents of information written to the capacitor 201 are read and decided by the sense amplifier 205. Then, if it is decided based on the decided contents of the information that electric charges are injected into the capacitor 201, electric charges are newly supplied. If it is decided based on the decided contents of the information that the electric charges are not injected, a writing operation is performed such that the electric charges in the capacitor 201 are eliminated.

The refresh operation is performed by applying a voltage to the selected gate-electrode 104 and source/drain region 105 to read and write the information stored in the memory cell capacitor as described above.

In a conventional semiconductor memory, however, a leakage current has been generated on a storage node and an n-p junction portion of a source/drain region of a MOS transistor and a semiconductor substrate to eliminate information in addition to the elimination of the information caused by the reading operation. In order to prevent the information from being eliminated by the leakage current, the refresh operation should be performed for information stored in all memory cells in a comparatively short cycle of about 1 msec to several hundreds msecs. Thus, there has been a problem in that power consumption of the semiconductor memory is increased by frequently performing the refresh operation.

Moreover, there has been a problem in that a time interval for refresh (a pause-refresh time) becomes short because the information stored in the memory cell cannot be read out during the refresh operation. If the pause-refresh time is short, a data utilization ratio for the operation is reduced.

SUMMARY OF THE INVENTION

In order to solve the above-mentioned problems, it is an object of the present invention to provide a method for manufacturing a semiconductor device which can obtain a MOS transistor having a reduction in a leakage current without unnecessarily damaging an integration degree.

A first aspect of the present invention is directed to a method for manufacturing a semiconductor device in which first and second MOS transistors of a second conductivity type are formed in first and second regions provided in an upper layer portion of a semiconductor substrate of a first conductivity type, respectively, comprising the steps of (a) forming a first source/drain region pair of a second conductivity type, a channel region of the first conductivity type which is positioned in the first source/drain region pair, and a gate-electrode region positioned on the channel region in the first and second regions, respectively, (b) forming a first sidewall on side-faces of the gate-electrode region of each of the first and second regions, (c) forming an interlayer dielectric film over a whole surface and forming a trench in only the first region through the interlayer dielectric film such that a side-face of the first sidewall is exposed, and (d) forming an insulating film for forming a second sidewall over a whole surface including the side-face of the first sidewall in the trench, and then removing the insulating film for forming the second sidewall in portions other than an inside of the trench, thereby forming the second sidewall on the side-face of the first sidewall, wherein the first MOS transistor is constituted by the first and second sidewalls, the first source/drain region pair, the channel region and the gate-electrode region in the first region, and the second MOS transistor is constituted by the first sidewall, the first source/drain region pair, the channel region and the gate-electrode region in the second region.

A second aspect of the present invention is directed to the method for manufacturing a semiconductor device according to the first aspect of the present invention, further comprising the step of (e) introducing an impurity of the second conductivity type from the trench, thereby forming a second source/drain region pair of the second conductivity type adjacently to the first source/drain region pair respectively after the step (c) and before the step (d).

A third aspect of the present invention is directed to the method for manufacturing a semiconductor device according to the second aspect of the present invention, further comprising the step of (f) introducing the impurity of the second conductivity type from the trench by using the second sidewall as a mask, thereby forming a third source/drain region pair adjacently to the second source/drain region pair respectively after the step (d).

A fourth aspect of the present invention is directed to the method for manufacturing a semiconductor device according to the third aspect of the present invention, wherein at least one of the second and third source/drain region pairs is formed more deeply than the first source/drain region pair.

A fifth aspect of the present invention is directed to the method for manufacturing a semiconductor device according to any of the first to fourth aspects of the present invention, wherein the first region includes a memory cell formation region of a semiconductor memory device and the second region includes a peripheral circuit formation region of the semiconductor memory device.

A sixth aspect of the present invention is directed to a method for manufacturing a semiconductor device in which a MOS transistor of a second conductivity type is formed on a semiconductor substrate of a first conductivity type, comprising the steps of (a) forming a source/drain region pair of the second conductivity type, a channel region of the first conductivity type which is positioned in the source/drain region pair, and a gate-electrode region positioned on the channel region over a surface of the semiconductor substrate, (b) forming an insulating film for a sidewall over a whole surface, (c) partially removing the insulating film for the sidewall on one side-face side of the gate-electrode region without exposing the semiconductor substrate, and (d) performing an etching treatment on the insulating film for the sidewall to remove the insulating film for the sidewall in portions other than a side-face of the gate-electrode region, thereby forming the sidewall on the side-face of the gate-electrode region by the remaining insulating film for the sidewall, the sidewall in the first region having a formation width of the other side-face side greater than a formation width of the one side-face side, wherein the MOS transistor is constituted by the sidewall, the source/drain region pair, the channel region and the gate-electrode region.

A seventh aspect of the present invention is directed to the method for manufacturing a semiconductor device according to the sixth aspect of the present invention, further comprising the step of (e) forming a memory cell capacitor on the semiconductor substrate after the step (d), one electrode of the memory cell capacitor being electrically connected to a source/drain region on the one side-face side of the source/drain region pair of the MOS transistor.

An eighth aspect of the present invention is directed to a semiconductor device comprising a semiconductor substrate of a first conductivity type having a memory cell formation region and a peripheral circuit formation region, first and second MOS transistors of a second conductivity type which are formed in the memory cell formation region and the peripheral circuit formation region, respectively, and a memory cell capacitor formed in the memory cell formation region and having one electrode electrically connected to one electrode region of the first MOS transistor, wherein a formation width of a sidewall provided on a side-face of a gate-electrode region of the first MOS transistor is set greater than a formation width of a sidewall provided on a side-face of a gate-electrode region of the second MOS transistor.

According to the first aspect of the present invention, as described above, the first MOS transistor formed in the first region by the method for manufacturing a semiconductor device has a structure in which the second sidewall is formed adjacently to the first sidewall so that a formation width of the whole sidewall surely becomes greater than a formation width of the sidewall of the second MOS transistor.

Accordingly, the first MOS transistor formed in the first region can reduce an electric field applied across a gate terminal region which is a pn junction interface of the first source/drain region pair and the channel region in the vicinity of the gate-electrode region by the sidewall widths of the first and second sidewalls more greatly than the MOS transistor formed in the second region.

In addition, at the step (d), the insulating film for forming the second sidewall is formed over the whole surface including the side-face of the first sidewall in the trench, and the insulating film for forming the second sidewall which is provided in the portions other than the inside of the trench is then removed. Consequently, the second sidewall is formed on the side-face of the first sidewall. Thus, it is possible to form, with high precision, the second sidewall adjacently to the first sidewall in self-alignment without the influence of the arrangement of other components.

According to the second aspect of the present invention, at the step (e), the second source/drain region pair is formed adjacently to the first source/drain region pair. Therefore, it is possible to comparatively gradually change an impurity distribution in the first and second source/drain region pairs in a transverse direction from the vicinity of the gate-electrode region to a contact provided on the first and second source/drain region pairs. As a result, it is possible to more relieve the electric field in the gate terminal region.

According to the third aspect of the present invention, at the step (f), the third source/drain region pair is formed adjacently to the second source/drain region pair. Therefore, it is possible to further gradually change the above-mentioned impurity distribution in the transverse direction. As a result, the electric field in the gate terminal region can be relieved still more.

According to the fourth aspect of the present invention, at least one of the second and third source/drain region pairs manufactured by the method for manufacturing a semiconductor device is formed more deeply than the first source/drain region pair. Therefore, an elongation of a depletion layer from the pn junction interface of the first to third source/drain region pairs is promoted. Consequently, an electric field in the pn junction portion including the gate terminal region can be relieved.

According to the fifth aspect of the present invention, the semiconductor device manufactured by the method for manufacturing a semiconductor device having such a structure that the first MOS transistor formed in the memory cell formation region has a greater sidewall formation width than in the second MOS transistor in the peripheral circuit formation region. Consequently, the electric field applied across the gate terminal region of the first MOS transistor formed in the memory cell formation region can be more relieved than in the second MOS transistor formed in the peripheral circuit formation region.

According to the sixth aspect of the present invention, at the steps (c) and (d), the formation width on one side-face side of the sidewall in the first region is set greater than the formation width on the other side-face side. Therefore, the electric field applied across the gate terminal region on the other side-face side which is the pn junction interface of the source/drain region and the channel region on the other side-face side in the vicinity of the gate-electrode region can be more reduced than in the gate terminal region on the one side-face side, by the sidewall width on the other side-face side.

In addition, the etching treatment by which the surface of the semiconductor substrate is exposed is performed at only the removal of the insulating film for forming the sidewall in the portions other than the side-face of the gate-electrode region at the step (d). Therefore, it is possible to obtain a semiconductor device in which a trap density to be introduced into the semiconductor substrate during the etching treatment is minimized and a leakage current is reduced.

According to the seventh aspect of the present invention, the method for manufacturing a semiconductor device comprises the step (e) of forming the memory cell capacitor having one of electrodes to be electrically connected to the source/drain region on the other side-face side having a greater sidewall width than on the one side-face side. Consequently, it is possible to control a leakage current sent from the memory cell capacitor with a reduction in the electric field applied across the gate terminal region on the other side-face side.

According to the eighth aspect of the present invention, the formation width of the sidewall provided on the side-face of the gate-electrode region of the first MOS transistor is set greater than the formation width of the sidewall provided on the side-face of the gate-electrode region of the second MOS transistor.

Accordingly, the first MOS transistor formed in the memory cell formation region can reduce the electric field applied across the gate terminal region acting as the pn junction interface between one or the other electrode regions in the vicinity of the gate-electrode region and the channel region, more than in the second MOS transistor formed in the peripheral circuit formation region.

As a result, it is possible to control a leakage current sent from the memory cell capacitor with a reduction in the electric field applied across the gate terminal region on one electrode region side to be connected to one electrode of the memory cell capacitor. In this case, the formation width of the sidewall of the second MOS transistor in the peripheral circuit formation region can be comparatively reduced, thereby minimizing an increase in an integration degree.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 19 and 20 are sectional views showing a first example of a method for forming second and third source/drain regions;

FIG. 34 is a circuit diagram showing an equivalent circuit of a memory cell of the DRAM.

DESCRIPTION OF THE PREFERRED EMBODIMENTS

First Embodiment

Principle

Figure 1:
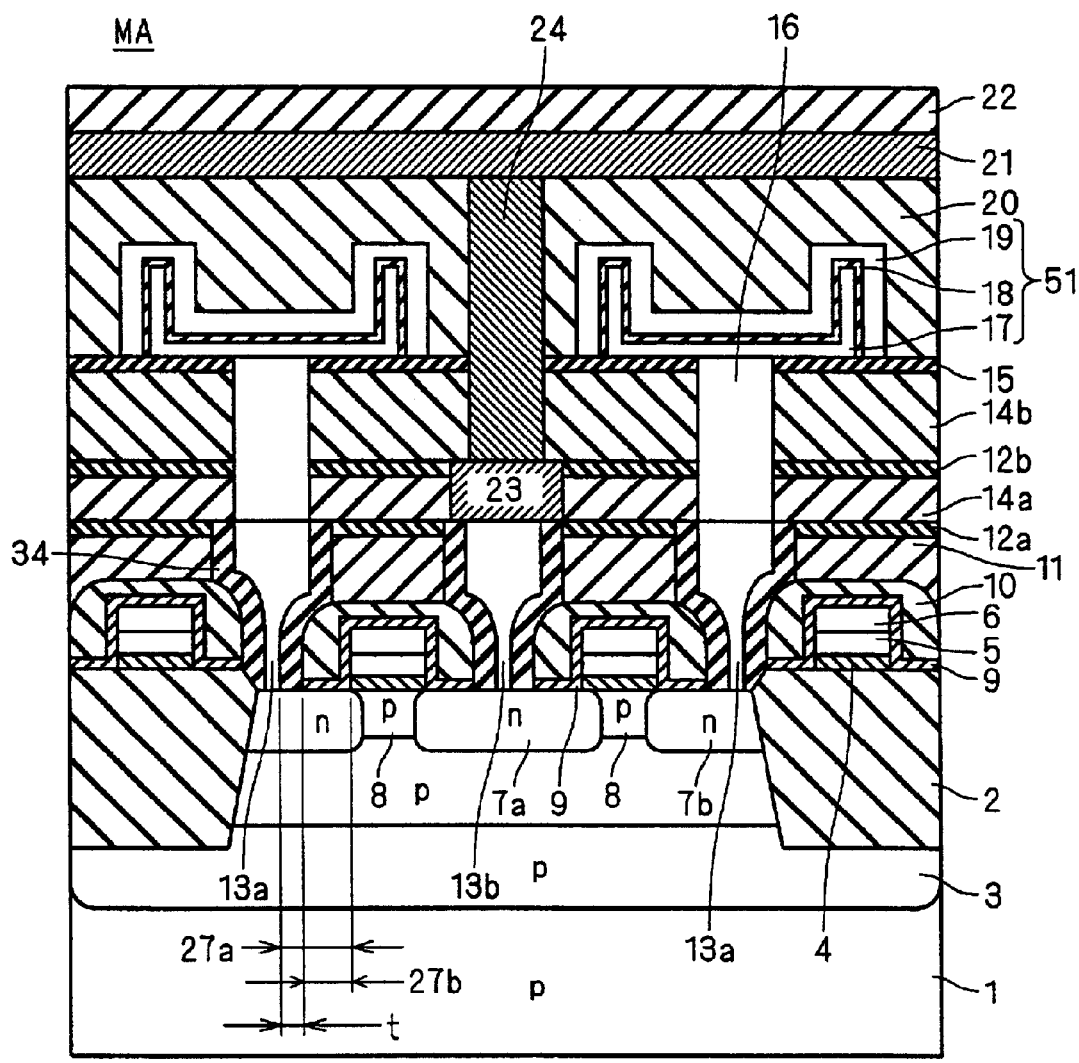
FIG. 1 is a sectional view showing a structure of a memory cell region of a DRAM manufactured by a method for manufacturing a DRAM according to a first embodiment.

Examples of a method for prolonging a pause-refresh time of a DRAM include a reduction in a leakage current generated on a source/drain region of a MOS transistor connected to a memory cell capacitor through a storage node in addition to an increase in a capacity of the memory cell capacitor.

The leakage current mainly comprises two kinds of leakage currents, that is, (1) a generated current in an SRH (Shockley-Read-Hall) process through a minute defect in a semiconductor substrate and (2) a leakage current generated by Trap Assisted Tunneling (TAT) and Band to Band Tunneling (BTBT) phenomena. The former (1) is increased if a depletion layer width is increased, and the latter (2) is increased if an electric-field strength in a depletion layer is increased. Accordingly, as the depletion layer width is more reduced and the electric-field strength in the depletion layer is more increased, the leakage current generated by the TAT is more increased.

For example, the BTBT has been disclosed in "E. O. Kane, "Zener Tunneling in Semiconductor," J. Phys. Chem. Solids, vol. 12, pp. 181–188, (1959)", the TAT has been disclosed in "G. A. M. Hurkx, D. B. M. Klaassen, and M. P. G. Knuver, "A new recombination model for device simulation including tunneling," IEEE Trans. on Electron Devices, VOL. 39, no. 2, pp. 331–338, (1992)", and the SRH has been disclosed in "R. N. Hall, "Electron-Hole Recombination in Germanium," Phys. Rev VOL. 87, p. 387 (1952)" and "W. Shockley and W. T. Read, "Statistics of the Recombination Holes and Electrons," Rhys. Rev. vol. 87, p. 835 (1952)".

As a fineness is more improved, an electric-field strength between a source/drain region and a channel region of a memory cell transistor is more increased. The reason is that a reduction in a source voltage is more retarded as compared with a scaling of a physical size of a memory cell transistor. For the background, there is a problem in that a minute signal for deciding the presence of electric charges in a memory cell capacitor by means of a sense amplifier is buried in a noise, resulting in a reduction in an S/N (Signal to noise ratio) if the source voltage is unnecessarily dropped.

When the electric-field strength in the memory cell transistor is increased, a leakage current generated by the TAT becomes dominant. Accordingly, it is necessary to reduce an internal electric-field strength of the memory cell transistor during a pause (a pause-refresh time) in order to prolong the pause-refresh time.

Examples of a method for reducing the internal electric-field strength of the memory cell transistor include a method for increasing a sidewall width of the memory cell transistor. The reason is as follows. An electric-field strength in a gate terminal region provided in the vicinity of a junction of the source/drain region and the channel region on the storage-node side during the pause has a value obtained as a rough approximation by dividing a difference between a voltage of a capacitor and a gate voltage by the sidewall width because a contact is generally formed adjacently to a sidewall over the source/drain region. For example, if the voltage of the capacitor during the pause is set to 2 V, the gate voltage is set to 0 V and the sidewall width is set to 40 nm, an electric-field strength obtained in the vicinity of the junction is about $5 \times 10^5$ V/cm. If the sidewall width can be set to 100 nm, the electric-field strength obtained in the vicinity of the junction is reduced to about $2 \times 10^5$ V/cm. However, when the sidewall width is increased, the area of the memory cell is increased, a chip area is increased and a theoretical chip number taken from one wafer is decreased. Therefore, there is a problem in that a manufacturing unit price per chip is increased.

In consideration of the above-mentioned problem, a MOS transistor manufactured by a method for manufacturing a DRAM according to a first embodiment of the present invention which will be described below has such a structure that a sidewall width of an NMOS in a DRAM (Dynamic Random Access Memory) memory cell region MA is larger than that of the NMOS in a peripheral region.

As described above, a value obtained by dividing an electric potential difference between the storage node and the gate-electrode of the cell transistor during the pause refresh by the sidewall width approximates to an electric-field strength in the gate terminal region. Accordingly, as the sidewall width is more increased, the electric-field strength in the gate terminal region is more reduced. When the electric-field strength in the gate terminal region is reduced, the leakage current generated by the TAT (Trap Assisted Tunneling) is decreased. Consequently, the pause-refresh time is prolonged. As a result, it is possible to obtain a DRAM having a long pause-refresh time by the method for manufacturing a DRAM according to the first embodiment of the present invention.

Description will particularly be given to the case where the MOS transistor according to the following first embodiment of the present invention produces great effects of the invention, that is, the case where the MOS transistor is formed on a silicon substrate.

Structure

Figure 2:
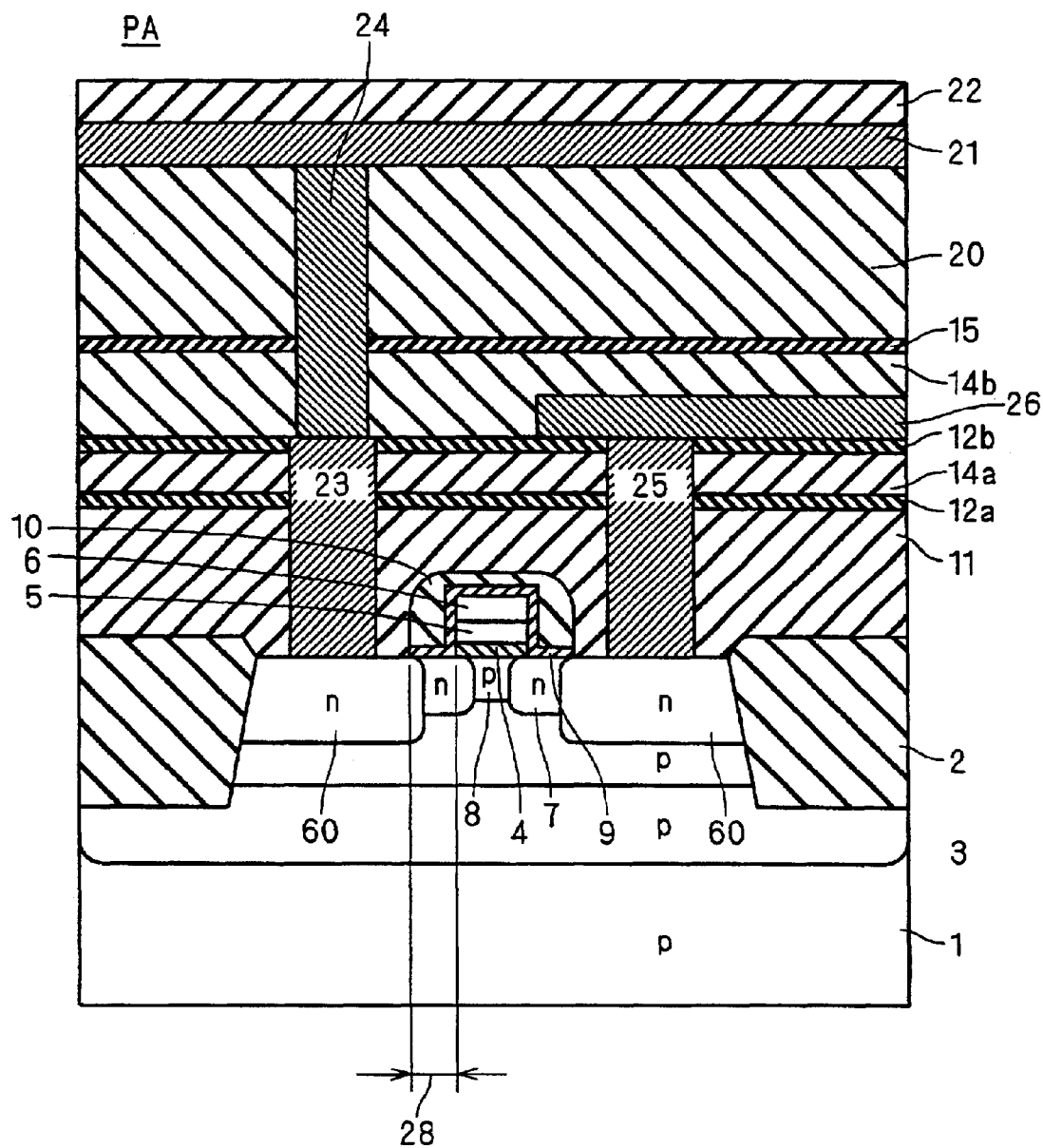
FIG. 2 is a sectional view showing a structure of a peripheral circuit region of the DRAM manufactured by the method for manufacturing a DRAM according to the first embodiment.

FIG. 1 is a sectional view showing a structure of a memory cell in a memory cell region of a DRAM manufactured by a method for manufacturing a DRAM according to the first embodiment of the present invention. FIG. 2 is a sectional view showing a structure of a transistor in a peripheral circuit region of the DRAM manufactured by the method for manufacturing a DRAM according to the first embodiment.

First of all, a memory cell region MA shown in FIG. 1 will be described below. As shown in FIG. 1, a p-type channel stopper layer 3 is formed in an intermediate layer portion of a p-type semiconductor substrate 1, and a STI 2 is selectively formed in an upper layer portion of the semiconductor substrate 1 and has a lower layer portion thereof provided in contact with an upper layer portion of a channel stopper layer 8. An NMOS transistor functioning as a memory cell transistor is formed in the upper layer portion of the semiconductor substrate 1 isolated by the STI 2. A memory cell capacitor 51 is formed in an upper layer portion of the NMOS transistor. A memory cell is constituted by the NMOS transistor and the memory cell capacitor 51.

The NMOS transistor comprises a gate insulating film 4, doped polysilicon 5, a WSi$_x$ layer 6, an n-type source/drain region 7, a channel dope layer 8, an insulating film 9 and sidewalls 10 and 34. A gate-electrode is constituted by the doped polysilicon 5 and the WSi$_x$ layer 6.

The source/drain regions 7a and 7b are formed on a surface of the semiconductor substrate 1 with the gate-electrodes 5 and 6 interposed therebetween, and the surface of the semiconductor substrate 1 provided between the source/drain regions 7a and 7b acts as the channel dope layer 8. The insulating film 9 having a silicon oxide film or a silicon nitride oxide film as a formation component is formed to cover the gate insulating film 4 and the gate-electrodes 5 and 6, and the sidewall 10 acting as a first sidewall which is made of a silicon nitride film is formed to cover the insulating film 9.

Furthermore, the sidewall 34 acting as a second sidewall which is made of a silicon nitride film is formed adjacently to the outside of the sidewall 10. Accordingly, a sidewall width 27a of the sidewalls 10 and 34 of the transistor in the memory cell region MA is increased by a thickness t of the sidewall 34 than a sidewall width 27b of the sidewall 10 itself.

A polysilicon pad 13a has a bottom face connected to the source/drain region 7 and a top face connected to a storage node 16 which will be described below. On the other hand, a polysilicon pad 13b has a bottom face connected to the source/drain region 7 and a top face connected to a bit line 21 through tungsten layers (tungsten plugs) 23 and 24.

Interlayer dielectric films 11 and 14 (14a and 14b) having TEOS as a formation component are formed over the whole surface of the semiconductor substrate 1 including the MOS transistor and the polysilicon pads 13a and 13b, and a silicon nitride film 12a is formed between the interlayer dielectric films 11 and 14a, a silicon nitride film 12b is formed between the interlayer dielectric films 14a and 14b, and a silicon nitride film 15 is formed on the interlayer dielectric film 14b. The polysilicon pads 13a and 13b and the sidewall 34 are formed through the interlayer dielectric film 11.

Then, a memory cell capacitor 51 is formed in a region on the silicon nitride film 15. The memory cell capacitor 51 is constituted by a lower electrode 17, a capacitor dielectric film 18 and a cell plate 19. The lower electrode 17 is made of a material such as amorphous silicon doped with phosphorus or doped polysilicon. The capacitor dielectric film 18 is made of a silicon oxide film, a silicon nitride film, Al$_2$O$_3$, Ta$_2$O$_5$ or the like. The cell plate 19 is made of polysilicon containing n-type impurities. The lower electrode 17 of the memory cell capacitor 51 is electrically connected to the polysilicon pad 13a through the storage node 16 formed penetrating the interlayer dielectric films 14a and 14b.

An interlayer dielectric film 20 having TEOS (Tetraethyl orthosilicate) as a formation component is formed over the whole surface of the silicon nitride film 15 including the memory cell capacitor 51, a bit line 21 made of tungsten or copper is formed on the interlayer dielectric film 20, and an interlayer dielectric film 22 having TEOS as a formation component is formed on the bit line 21. The bit line 21 and the tungsten layer 23 are electrically connected through the tungsten layer 24 formed penetrating the interlayer dielectric film 20, the silicon nitride film 15 and the interlayer dielectric film 14b.

Next, description will be given to a peripheral circuit region PA shown in FIG. 2. An NMOS transistor is constituted by the gate insulating film 4, the doped polysilicon 5, the WSi$_x$ layer 6, an n-type source/drain region 7P, the channel dope layer 8, the insulating film 9 and the sidewall 10 made of a silicon nitride film, and a gate-electrode is constituted by the doped polysilicon 5 and the WSi$_x$ layer 6.

Since a sidewall width 28 of the sidewall 10 of a transistor in the peripheral circuit region PA is equal to the sidewall width 27b, it is smaller than the sidewall width 27a in the memory cell region MA by a thickness t of the sidewall 34.

A second source/drain region 60 is formed adjacently to a source/drain region 7P. Interlayer dielectric films 11 and 14a are formed over the whole surface of the semiconductor substrate 1 including a MOS transistor, a silicon nitride film 12a is formed between the interlayer dielectric films 11 and 14a, and a silicon nitride film 12b is formed on the interlayer dielectric film 14a.

A metal wiring 26 made of tungsten or copper is formed on a part of the silicon nitride film 12b, an interlayer dielectric film 14b is formed over the whole surface of the silicon nitride film 12b including the metal wiring 26, a silicon nitride film 15 is formed on the interlayer dielectric film 14b, and an interlayer dielectric film 20 is formed on the silicon nitride film 15.

The metal wiring 26 is electrically connected to one electrode side (the right side in FIG. 2) of the second source/drain region 60 through a tungsten layer 25 formed penetrating the silicon nitride films 12a and 12b, the interlayer dielectric film 11 and the interlayer dielectric film 14a.

The bit line 21 is formed on the interlayer dielectric film 20, and the interlayer dielectric film 22 is formed on the bit line 21. The bit line 21 and the tungsten layer 23 on the other electrode side (the left side in FIG. 2) of the second source/drain region 60 are electrically connected through the tungsten layer 24 formed penetrating the interlayer dielectric films 20 and 14b and the silicon nitride film 15 and through the tungsten layer 23 formed penetrating the interlayer dielectric films 11 and 14a and the silicon nitride films 12a and 12b.

Features

In such a structure, electrons are drawn from the lower electrode 17 of the memory cell capacitor 51 during writing. At this time, an electric potential VSC of the lower electrode 17 is a power supply voltage Vdd. During pause refresh, for example, VGS=0V is applied to the gate-electrode, −1V is applied to the substrate and Vdd/2 is applied to the bit line. If Vdd=2V is set, an electric-field strength Egate of a gate-electrode terminal on the surface of the semiconductor substrate 1 can be approximated in the following equation (I) during the pause refresh.

$$Egate=(VSC-VGS)/LSW \qquad (I)$$

wherein LSW represents the sidewall width 27 of the MOS transistor of the memory cell. In the equation (I), if LSW=40 nm is set, for example, the electric-field strength Egate is about 5×10$^5$ V/cm in the vicinity of a gate terminal region.

With this electric-field strength, the leakage current generated by the TAT is more dominant than the current generated in the SRH (Shockley-Read-Hall) process.

On the other hand, if LSW=80 nm is set, the electric-field strength is about $2.5 \times 10^5$ V/cm in the vicinity of the gate terminal region. Since the TAT has a high sensitivity for the electric-field strength. Therefore, if the electric-field strength is reduced by half, the leakage current is decreased by about one to two orders of magnitude.

For the pause-refresh time, a leakage electronic current enters the lower electrode 17 and an electric potential of the lower electrode 17 is reduced to Vdd/2. Therefore, it is desired that the leakage current should be small. In order to correspond to a production cost, however, the physical size of the memory cell should be reduced to result in a smaller chip size and a theoretical chip number taken per wafer should be increased. Therefore, the physical size of the memory cell has been reduced but there has not been a drop in the source voltage Vdd corresponding to the reduction in the physical size to increase the S/N on the bit line.

In order to investigate the presence of electric charges stored in a predetermined capacitor, an electric potential of the predetermined capacitor is compared with that of a reference capacitor by means of a sense amplifier. When the power supply voltage Vdd is dropped, the S/N of a signal for deciding the presence of the electric charges is reduced. For this reason, the source voltage cannot be dropped unnecessarily. Therefore, electric-field strengths in the memory cell and the transistor are increased. As a result, there is a problem in that the leakage current generated by the TAT is increased and the pause-refresh time is shortened as described above.

According to the structures of the semiconductor device manufactured by the method for manufacturing a DRAM in accordance with the first embodiment which are shown in FIGS. 1 and 2, the sidewall width 27a of the transistor formed in the memory cell region MA is greater than the sidewall width 28 of the transistor formed in the peripheral circuit region PA. Therefore, an internal electric field of the transistor (an electric field in the gate terminal region) can be relieved. Thus, a DRAM having a long pause-refresh time can be implemented.

Manufacturing Method

FIGS. 3 to 16 are sectional views showing the method for manufacturing a DRAM according to the first embodiment of the present invention. FIGS. 3, 5, 7, 11, 13 and 15 are sectional views showing the structure of the memory cell in the memory cell region MA of the DRAM. FIGS. 4, 6, 8, 10, 12, 14 and 16 are sectional views showing the structure of the transistor in the peripheral region of the DRAM.

The method for manufacturing a DRAM according to the first embodiment of the present invention will be described below with reference to FIGS. 3 to 16.

Figure 3:
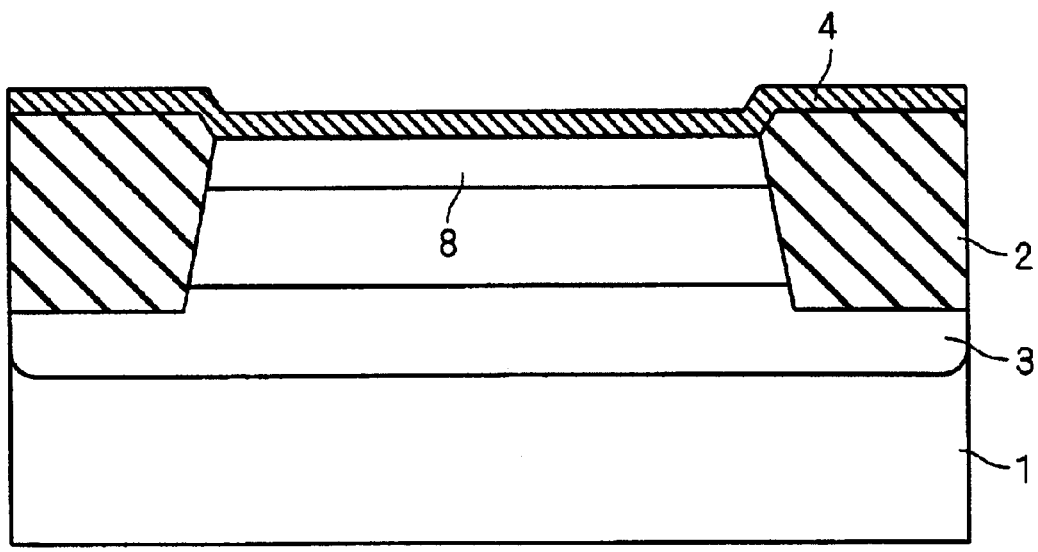
FIG. 3 is a sectional view showing the method for manufacturing a DRAM (memory cell region) according to the first embodiment.
Figure 4:
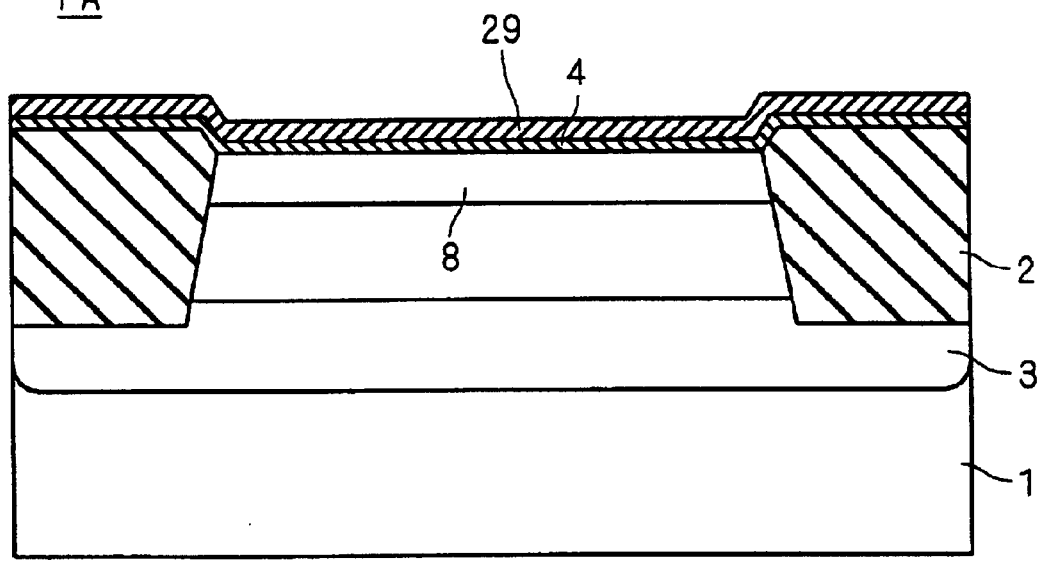
FIG. 4 is a sectional view showing the method for manufacturing a DRAM (peripheral circuit region) according to the first embodiment.

First of all, steps shown in FIGS. 3 and 4 will be described below. In both the memory cell region MA and the peripheral circuit region PA, a STI 2 is selectively formed in an upper layer portion of an n-type semiconductor substrate 1, an underlying oxide film (not shown) is then formed on a surface of the semiconductor substrate 1, a well layer (not shown), a channel stopper layer 3 and a channel dope layer 8 are sequentially formed over the underlying oxide film by implanting p-type impurity ions three times, and the underlying oxide film is thereafter removed by etching.

Subsequently, a gate insulating film 4 having a thickness of about 4 nm, for example, is formed on the surface of the semiconductor substrate 1 in an oxidation atmosphere. Then, a silicon nitride film is deposited over the whole surface and is subjected to patterning by using a resist mask in order to cover only a silicon nitride film 29 in the peripheral circuit region PA.

On the other hand, the silicon nitride film 29 is removed by etching such that the gate insulating film 4 is exposed in the memory cell region MA. Next, after the resist is removed by the etching, thermal oxidation is carried out again. At this time, the gate insulating film 4 is exposed in the memory cell region MA. Therefore, the oxidation progresses. As shown in FIG. 3, consequently, a thickness of the gate insulating film 4 in the memory cell region MA is finally increased to about 7 nm. On the contrary, the peripheral circuit region PA is covered with the silicon nitride film 29. Therefore, a thickness of the gate oxide film is kept at 4 nm without oxidation.

In order to increase a current during writing and to drop a voltage by a threshold voltage during transfer of an electric potential from a bit line to a capacitor element (a memory cell capacitor) and complement the drop in the voltage, a gate voltage of the MOS transistor is raised to a higher electric potential than the source voltage during the writing. For the following reason, the thickness of the gate insulating film 4 in the memory cell region MA is made greater than that of the gate insulating film 4 formed in the peripheral circuit region PA. Since the gate insulating film of the memory cell transistor has a great stress, the thickness of the film should correspondingly be increased to keep the reliability of the gate insulating film of the memory cell transistor. An increase in the thickness of the gate insulating film 4 in the memory cell region MA is less related to the present invention. Therefore, the gate insulating films 4 in the memory cell region MA and the peripheral circuit region PA have almost the same thicknesses in FIG. 5 and the succeeding drawings.

Next, steps shown in FIGS. 5 and 6 will be described. After the silicon nitride film 29 formed in the peripheral circuit region PA is removed, non-doped amorphous silicon (not shown) is deposited over the whole surface. Then, an N channel transistor formation region and a P channel transistor (not shown) formation region are alternately covered with a resist mask (not shown), and phosphorus ions are implanted in the amorphous silicon of the N channel transistor formation region and boron ions are implanted in the amorphous silicon of the P type transistor formation region. Thereafter, recrystallization is performed by a heat treatment. Thus, doped polysilicon can be obtained.

Subsequently, a $WSi_x$ layer 6 (x=2 to 3) is deposited over the whole surface. An insulating film 30 is deposited and a resist mask is then patterned. Thus, a gate-electrode comprising the doped polysilicon 5 and the $WSi_x$ layer 6 is formed by doped polysilicon and reactive ion etching.

Thereafter, the N channel and P channel transistor formation regions are alternately covered with the resist mask, and at least one of dopants such as boron, phosphorus, arsenic and the like is implanted in self-alignment by using the gate-electrode as a mask, thereby forming a source/drain region 7.

Figure 7:
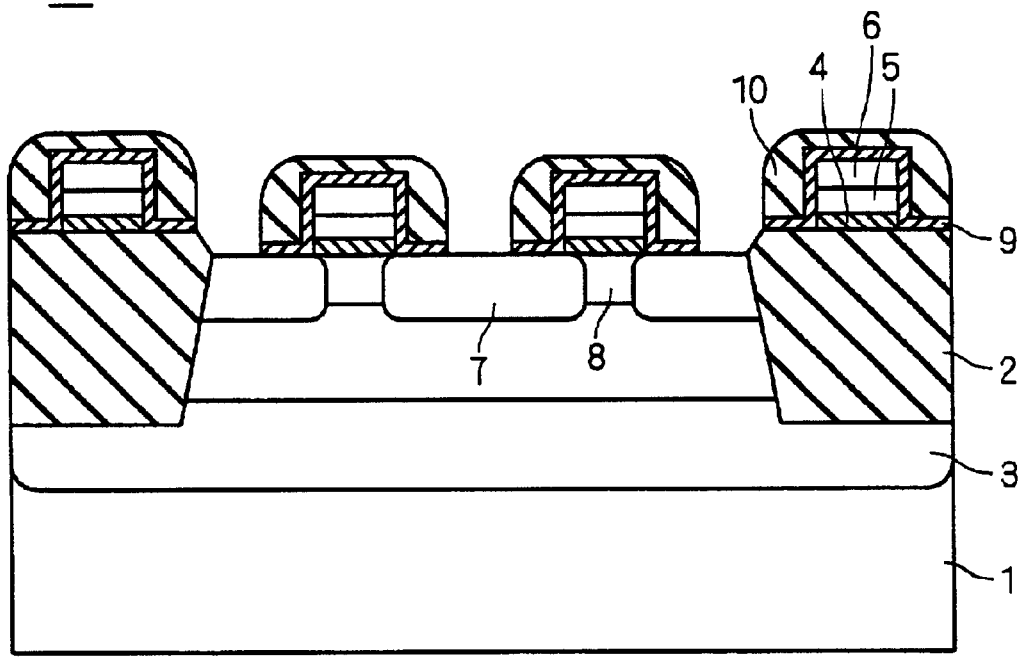
FIG. 7 is a sectional view showing the method for manufacturing a DRAM (memory cell region) according to the first embodiment.
Figure 8:
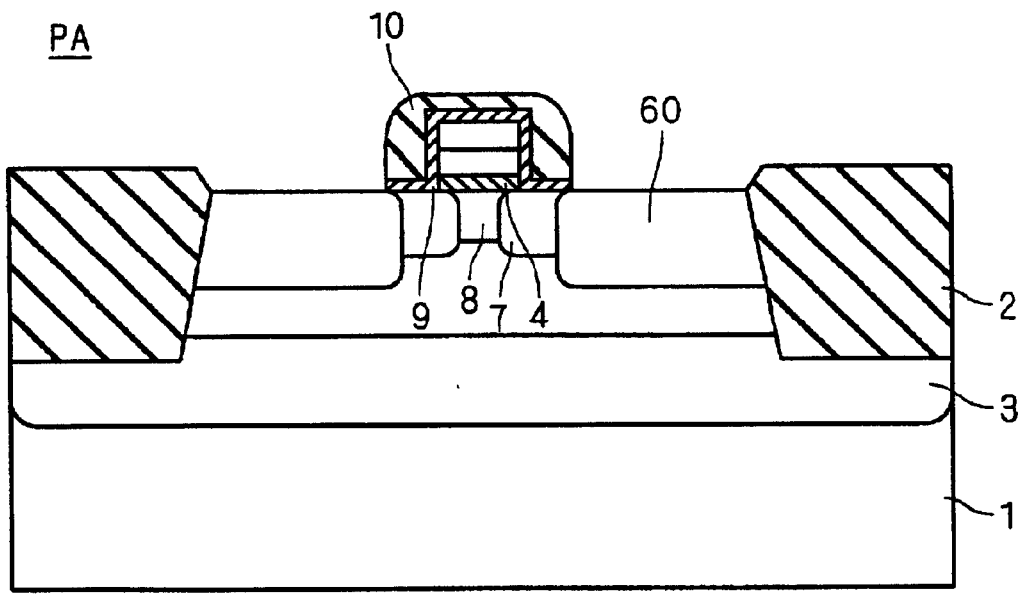
FIG. 8 is a sectional view showing the method for manufacturing a DRAM (peripheral circuit region) according to the first embodiment.

Next, steps shown in FIGS. 7 and 8 will be described. The surface of the gate-electrode is nitrided and oxidized in a nitriding and oxidizing atmosphere. At the nitriding and oxidizing step, for example, thermal oxidation may be carried out in an $N_2O/O_2$ atmosphere or may be carried out in a dry $O_2$ atmosphere after a heat treatment is performed in an $N_2$ atmosphere.

For example, after a silicon nitride film is deposited in a thickness of 50 nm, it is subjected to reactive ion etching, thereby simultaneously forming an insulating film 9

(comprising the insulating film 30 and the nitride oxide film formed at the nitriding and oxidizing step) and a sidewall 10. At this time, both the transistor in the memory cell region MA and the transistor in the peripheral circuit region PA have a sidewall width of about 40 nm. In only the peripheral circuit region PA, a second source/drain region 60 overlapping with the source/drain region 7 is formed by ion implantation or the like using the sidewall 10 as a mask.

Figure 9:
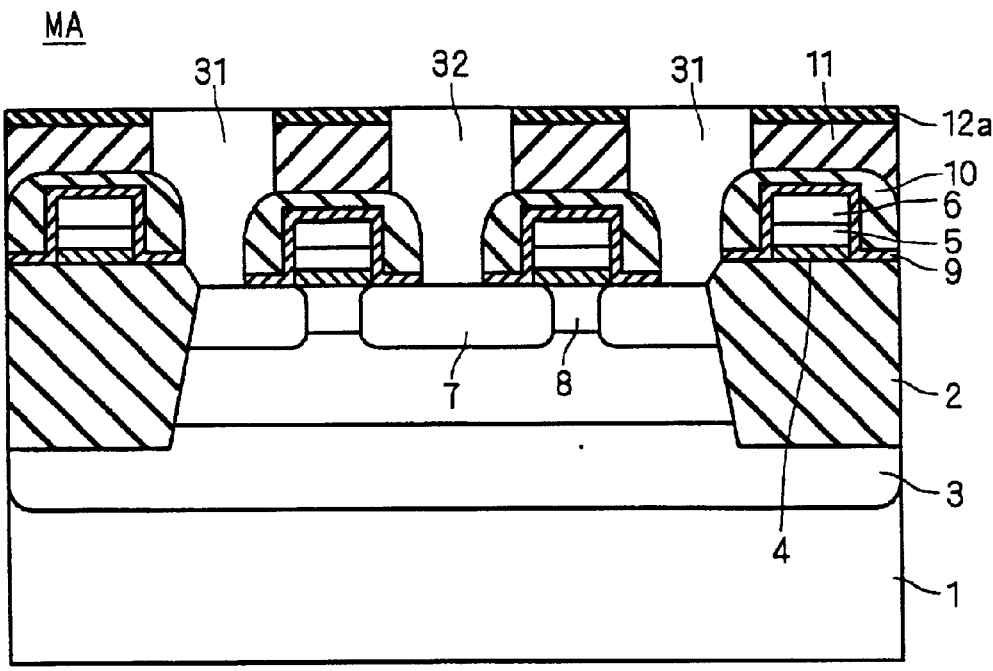
FIG. 9 is a sectional view showing the method for manufacturing a DRAM (memory cell region) according to the first embodiment.
Figure 10:
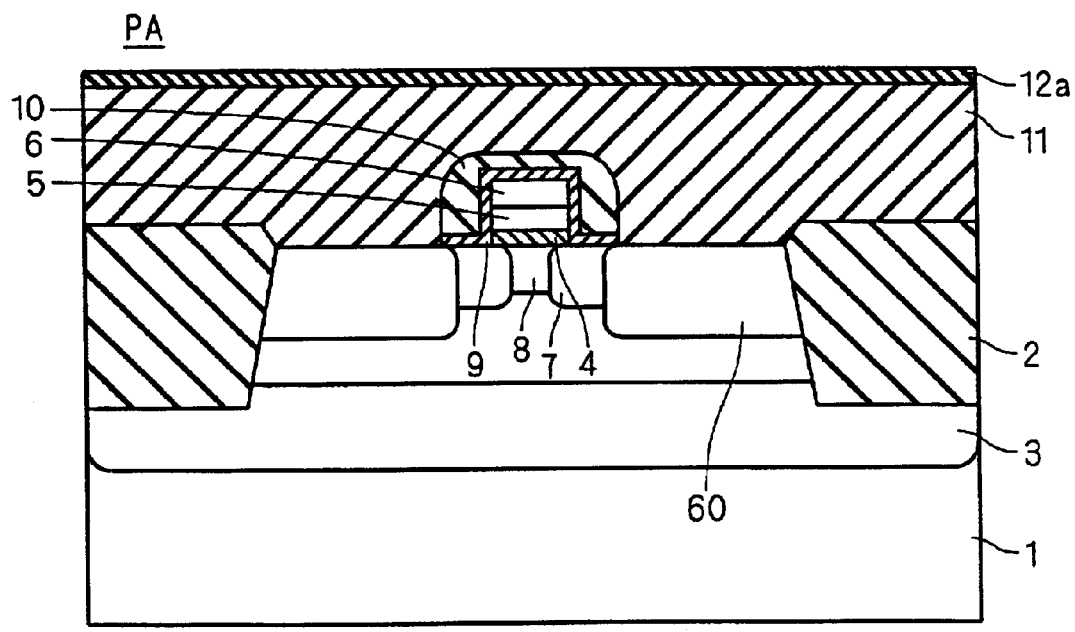
FIG. 10 is a sectional view showing the method for manufacturing a DRAM (peripheral circuit region) according to the first embodiment.

Next, steps shown in FIGS. 9 and 10 will be described. An interlayer dielectric film (a silicon oxide film or TEOS) 11 is deposited over the whole surface, and a silicon nitride film 12a is then deposited on the interlayer dielectric film 11.

Then, after mask patterning is carried out, trenches 31 and 32 are formed through the sidewall 10 and the silicon nitride film 12a by the reactive ion etching such that a side-face of the sidewall 10 is exposed to only the memory cell region MA. The reactive ion etching has a great etching selection ratio of the sidewall 10 to the interlayer dielectric film 11. Therefore, the sidewall 10 is hardly removed. The surface of the semiconductor substrate 1 is exposed to bottom faces of the trenches 31 and 32. At this time, for example, phosphorus or arsenic ions may be implanted at an implantation energy of 10 keV to 100 keV, thereby forming a second source/drain region (not shown) adjacent to the source/drain region 7 in the memory cell region MA.

Figure 11:
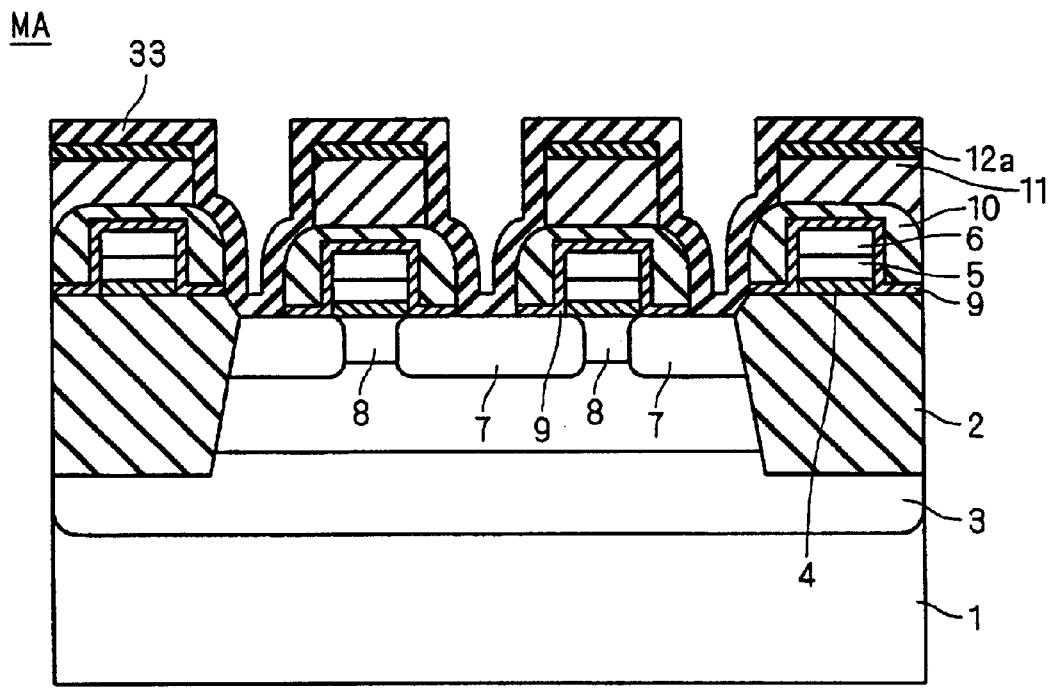
FIG. 11 is a sectional view showing the method for manufacturing a DRAM (memory cell region) according to the first embodiment.
Figure 12:
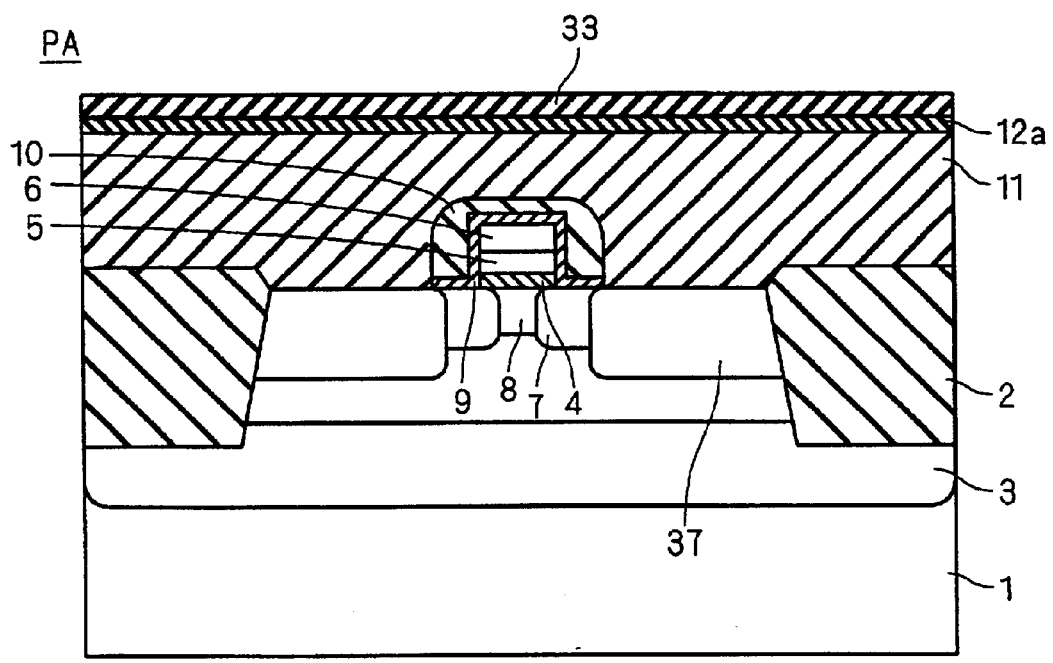
FIG. 12 is a sectional view showing the method for manufacturing a DRAM (peripheral circuit region) according to the first embodiment.

Next, steps shown in FIGS. 11 and 12 will be described. After a resist for forming the trenches 31 and 32 is removed, a silicon nitride film 33 is formed over the whole surface. In this case, the silicon nitride film 33 is deposited along internal walls of the trenches 31 and 32.

Figure 17:
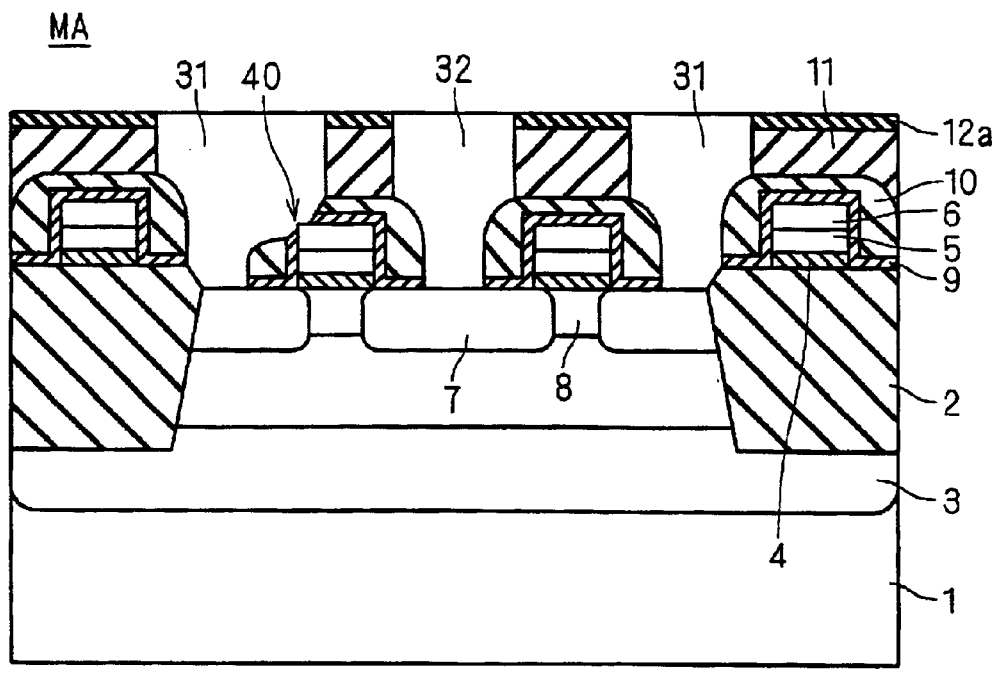
FIG. 17 is a sectional view showing a situation in which a gate-electrode is exposed at a middle step.
Figure 18:
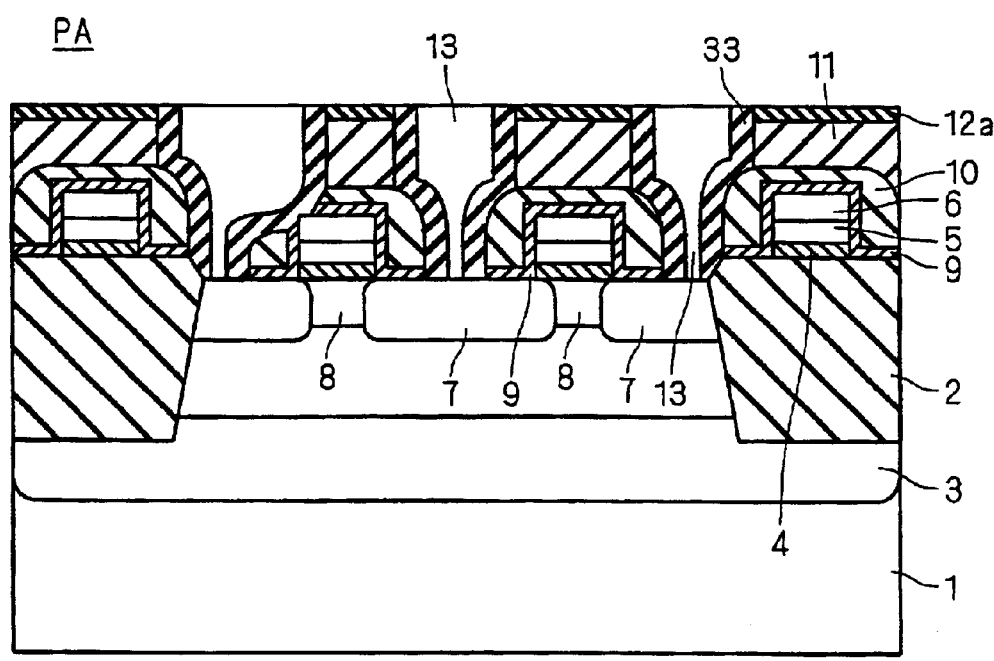
FIG. 18 is a sectional view illustrating the effects of the first embodiment.

Other reasons for depositing the silicon nitride film 33 will be described below. As shown in FIG. 17, a part of the sidewall 10 acting as a first sidewall is removed by etching for some reason when the trenches 31 and 32 are to be formed, and an exposed portion 40 of the gate-electrode is therefore generated in some cases. If the amorphous silicon is doped in this state, the gate-electrode and the amorphous silicon are short-circuited so that the memory cell does not normally operate. In order to eliminate this drawback, the silicon nitride film 33 is deposited on the internal walls of the trenches 31 and 32 as shown in FIG. 18, and a second sidewall is then formed by the reactive ion etching and doped amorphous silicon for a polysilicon pad 13 is deposited. Even if the exposed portion 40 of the gate-electrode is formed, the amorphous silicon and the gate-electrode can be prevented from being short-circuited because the silicon nitride film 33 for a second sidewall is an insulating film.

Figure 13:
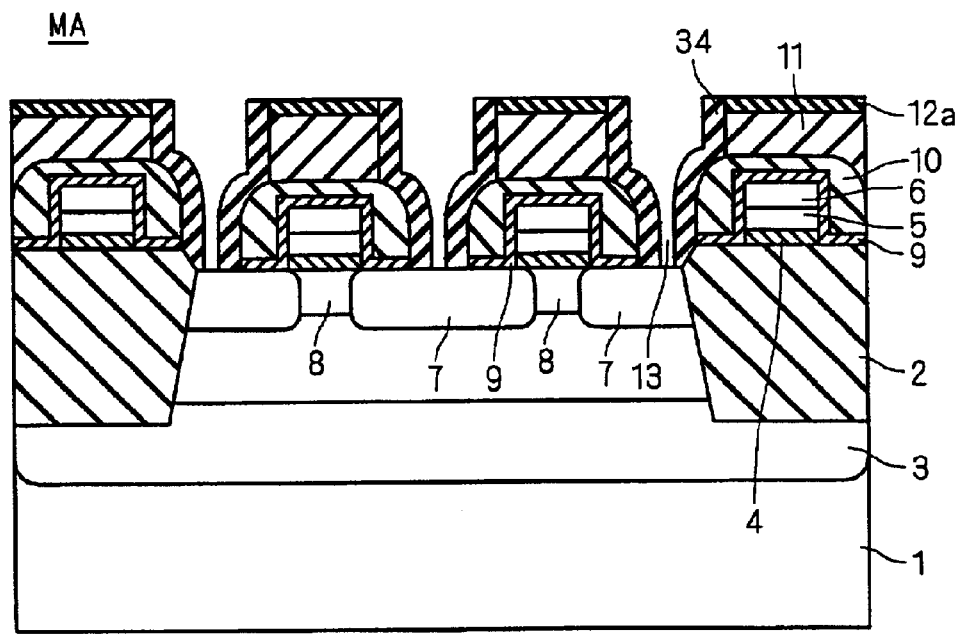
FIG. 13 is a sectional view showing the method for manufacturing a DRAM (memory cell region) according to the first embodiment.
Figure 14:
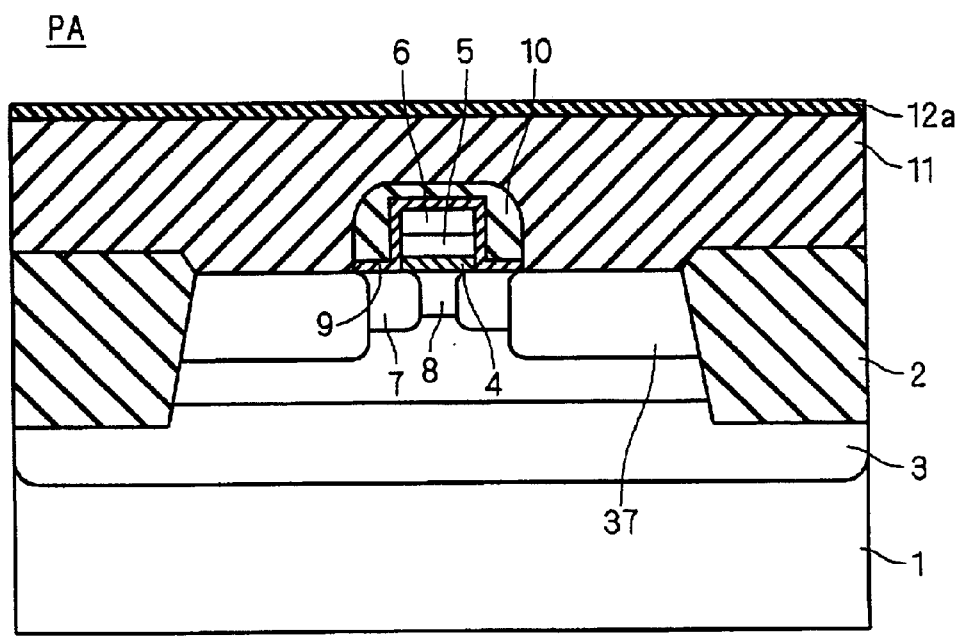
FIG. 14 is a sectional view showing the method for manufacturing a DRAM (peripheral circuit region) according to the first embodiment.

Next, steps shown in FIGS. 13 and 14 will be described. When the silicon nitride film 33 is subjected to the reactive ion etching, the silicon nitride film 33 provided on the silicon nitride film 12a and the silicon nitride film 33 provided on the bottom faces of the trenches 31 and 32 are mainly removed by the etching. At this time, a part of the silicon nitride film formed along the internal walls of the trenches 31 and 32 is also removed so that a sidewall 34 acting as a second sidewall is formed in the memory cell region MA. At this time, for example, phosphorus or arsenic ions may be implanted at an implantation energy of 10 keV to 100 keV, thereby forming a third source/drain region (not shown) adjacently to the second source/drain region in the memory cell region MA. The second sidewall may be formed of any of a TEOS film, a silicon nitride oxide film and a silicon oxide film in place of the silicon nitride film.

Figure 15:
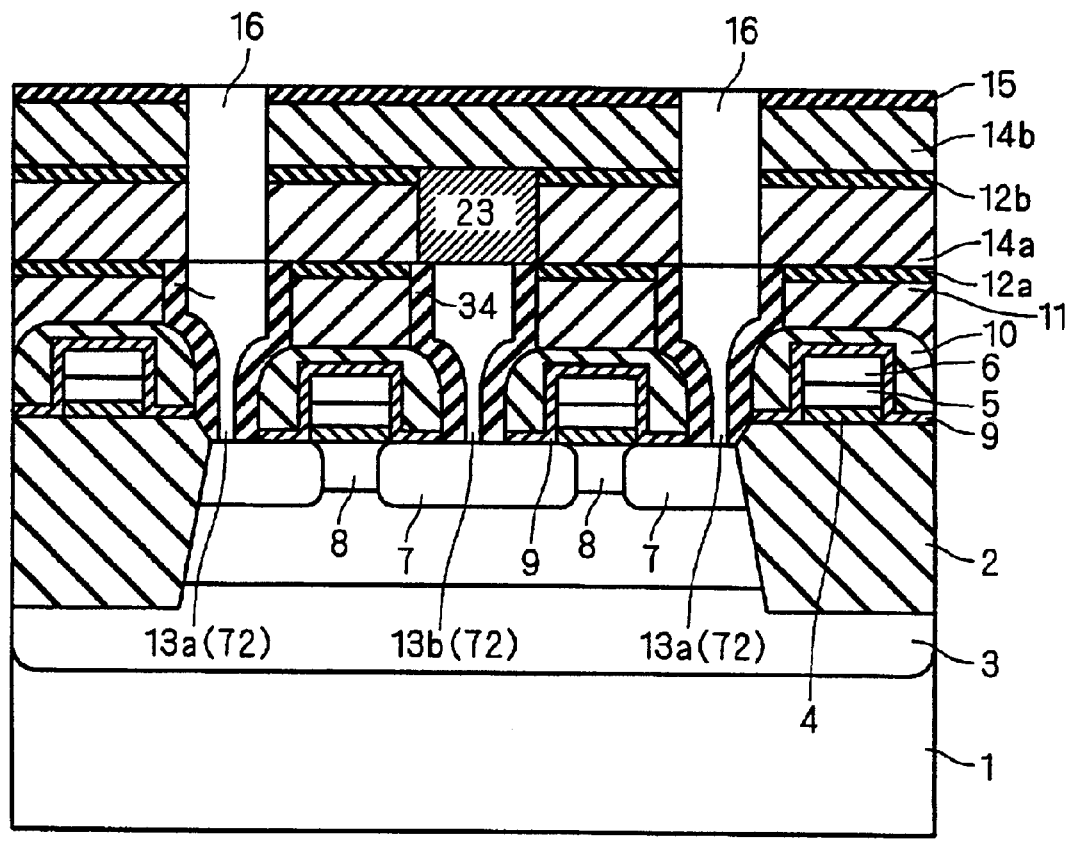
FIG. 15 is a sectional view showing the method for manufacturing a DRAM (memory cell region) according to the first embodiment.
Figure 16:
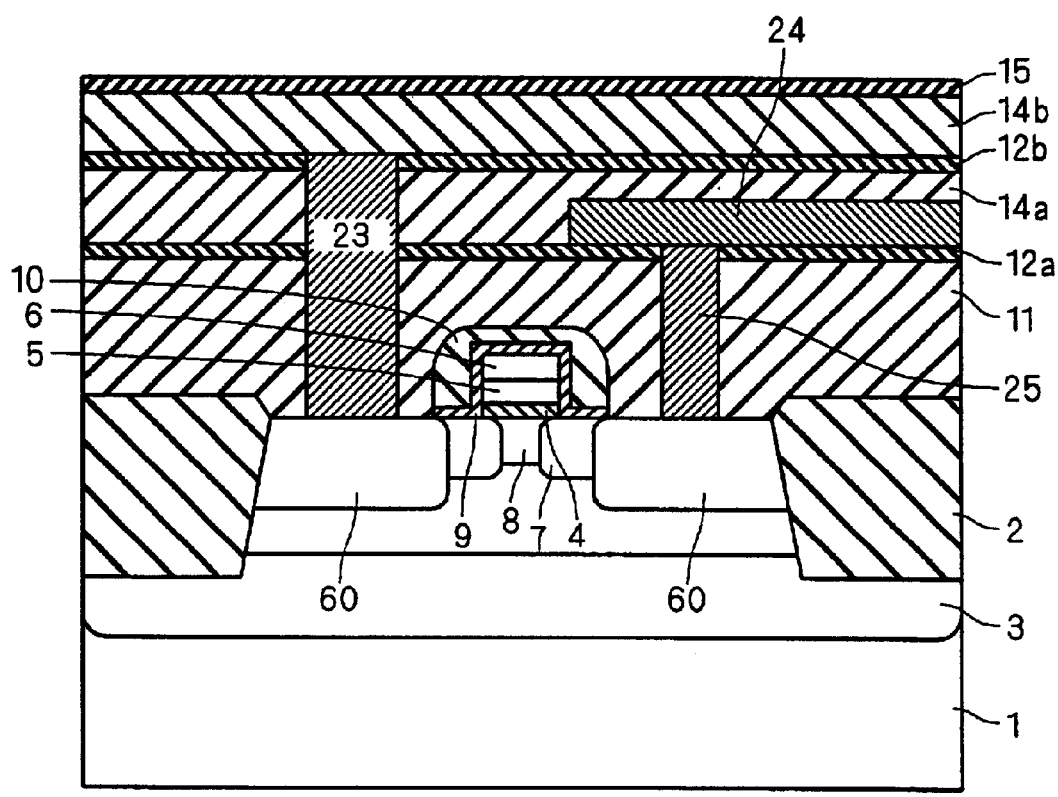
FIG. 16 is a sectional view showing the method for manufacturing a DRAM (peripheral circuit region) according to the first embodiment.

Next, steps shown in FIGS. 15 and 16 will be described. Amorphous silicon doped with phosphorus is deposited to fill in a contact hole and an upper face of the amorphous silicon is then planarized with CMP (Chemical Mechanical Polishing) by using the silicon nitride film 12a as a stopper, thereby forming an amorphous silicon layer 72.

Then, an interlayer dielectric film 14a is deposited over the whole surface and the silicon nitride film 12b is deposited on the interlayer dielectric film 14a. Thereafter, mask patterning is carried out to form a contact hole. After TiN is deposited on an internal wall and a bottom of the contact hole, the contact hole is filled with W. The TiN acts as a barrier metal. Next, planarization is carried out with the CMP by using the silicon nitride film 12b as a stopper, thereby forming a tungsten layer 23.

Subsequently, an interlayer dielectric film 14b is deposited over the whole surface and a silicon nitride film 15 is deposited on the interlayer dielectric film 14b. Then, after a contact hole is formed, amorphous silicon doped with phosphorus is deposited to fill in the contact hole and is planarized with the CMP by using the silicon nitride film 15 as a stopper. Consequently, a storage node 16 is formed. The amorphous silicon 72 and the storage node 16 are recrystallized by a heat treatment and then become polysilicon or a silicon single crystal. It is assumed that the amorphous silicon 72 is recrystallized to form polysilicon pads 13a and 13b. Moreover, a dopant doped in the polysilicon pad 13 (the amorphous silicon 72) and the storage node 16 is also activated electrically.

On the other hand, the tungsten layer 23 is formed on the second source/drain region 60 on one electrode side by an existing method also in the peripheral circuit region PA, and a tungsten layer 25 is formed in a second source/drain region 60 on the other electrode side. Thus, a tungsten layer 24 electrically connected to the tungsten layer 25 is formed.

Subsequently, a memory cell capacitor 51 including a lower electrode 17 which is in contact with the storage node 16, an interlayer dielectric film 20, a bit line 21 and an interlayer dielectric film 22 are formed by an existing method. Consequently, the structures shown in FIGS. 1 and 2 are completed.

With the structure of the memory cell transistor manufactured by the method for manufacturing a DRAM according to the first embodiment, the sidewall width 27a of the transistor in the memory cell region MA is greater than the sidewall width 27b of the memory cell transistor having the conventional structure, thereby relieving an electric-field strength in the gate terminal region in the vicinity of an end of the gate-electrode where a pn junction interface of the source/drain region and the channel region is present. Therefore, a leakage current is reduced during the pause. Consequently, it is possible to implement a DRAM having a long pause-refresh time.

According to the method for manufacturing a DRAM according to the first embodiment of the present invention, an insulating film for a second sidewall is formed on a side-face of a first sidewall which is exposed and is then removed partially, thereby forming the second sidewall in self-alignment in only the memory cell region MA. Thus, the sidewall width of the memory cell transistor is made greater than that of the transistor in the peripheral circuit region PA.

Accordingly, the sidewall width of the transistor formed in the memory cell region MA is uniformly formed in self-alignment. Therefore, there is no pattern dependency (the sidewall width is not affected by a positional relationship with a peripheral component).

For example, in the case where an insulating film for forming a sidewall is deposited on the gate-electrode, a thickness of the insulating film deposited on the gate-electrode depends on a height and position of the surrounding gate-electrode. More specifically, since the thickness of the insulating film to be deposited is changed depending on the position of the surrounding gate-electrode, the pattern dependency appears on the sidewall width. A process for forming a second sidewall of the method for manufacturing a DRAM according to the first embodiment has no pattern dependency.

Formation of Second and Third Source/Drain Regions

When second and third source/drain regions are formed adjacently to the source/drain region 7 acting as a first source/drain region, a distribution of a dopant of the source/drain region in a transverse direction is gradually changed from the polysilicon pad 13 which is a contact portion of the source/drain region toward the gate-electrode. Therefore, it is possible to obtain the effect of relieving an electric field in the gate terminal region to reduce a leakage current. Moreover, a contact resistance between the polysilicon pad 13 and the semiconductor substrate 1 is dropped and a concentration of the source/drain region is increased so that a resistance value thereof is reduced. Consequently, it is also possible to obtain the effect of enhancing current driving force of the memory cell transistor.

FIGS. 19 and 20 are sectional views showing a first example of a method for forming the second and third source/drain regions. As shown in FIG. 19, trenches 31 and 32 are formed (at the step shown in FIG. 9) in the memory cell region MA such that a side-face of the sidewall 10 acting as a first sidewall is exposed. Then, phosphorus ions are implanted in a manner of self-alignment to form a second source/drain region 35 more shallowly than the source/drain region 7. The ions are not implanted in the source/drain region 7 provided under the sidewall 10. Therefore, the second source/drain region 35 is formed in the source/drain region 7 acting as the first source/drain region.

As shown in FIG. 20, next, a sidewall 34 acting as a second sidewall is formed and phosphorus ions are then implanted in a manner of self-alignment to form a third source/drain region 36 adjacently to the second source/drain region 35. In this case, the third source/drain region 36 is formed to reach a channel stopper layer 3 more deeply than the source/drain region 7.

Referring to a concentration distribution from the source/drain region in the vicinity of the surface of the semiconductor substrate 1 toward a channel, a concentration is smoothly reduced in order of the third, second and first source/drain regions 36, 35 and 7. Therefore, an electric-field strength is alleviated in the gate terminal region. Moreover, the third source/drain region 36 is formed deeply in the semiconductor substrate 1. Therefore, a depletion layer easily spreads around the pn junction face of the third, second and first source/drain regions 36, 35 and 7. Thus, the electric field can further be relieved.

Figure 21:
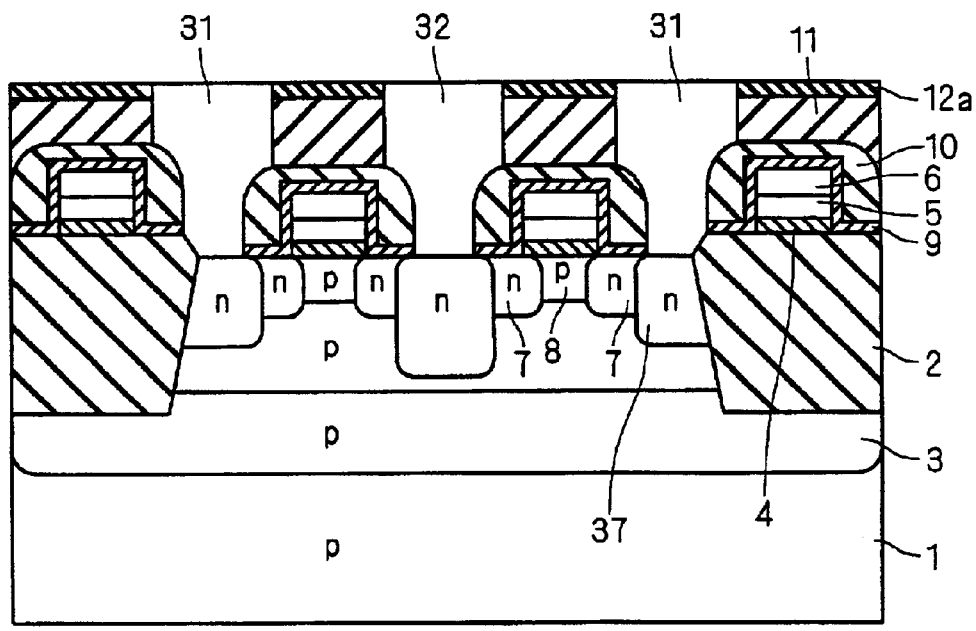
FIGS. 21 and 22 are sectional views showing a second example of the method for forming second and third source/drain regions.
Figure 22:
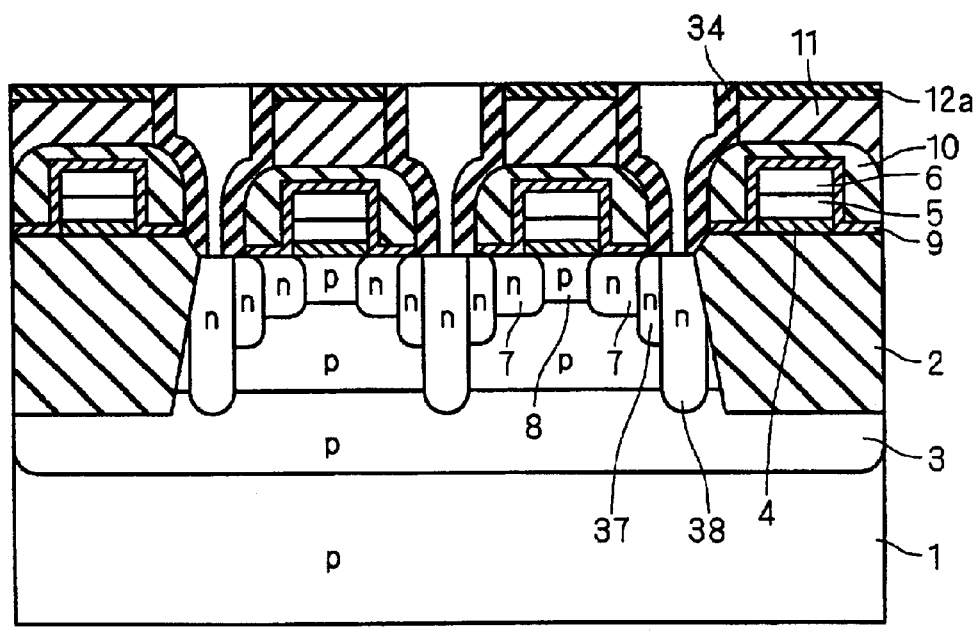

FIGS. 21 and 22 are sectional views showing a second example of the method for forming the second and third source/drain regions. As shown in FIG. 21, trenches 31 and 32 are formed (at the step shown in FIG. 9) such that a side-face of the sidewall 10 acting as the first sidewall is exposed, and phosphorus ions are then implanted in a manner of self-alignment to form a second source/drain region 37 more deeply than the source/drain region 7. More specifically, the structure of the second example is different from that of the first example shown in FIG. 19 in that the second source/drain region 37 is formed more deeply than the source/drain region 7 acting as the first source/drain region.

As shown in FIG. 22, next, a sidewall 34 acting as a second sidewall is formed, and phosphorus ions are then implanted in manner of self-alignment to form a third source/drain region 38. A third source/drain layer is formed to reach the channel stopper layer 3 more deeply than the second source/drain layer.

Referring to a concentration distribution from the source/drain region in the vicinity of the surface of the semiconductor substrate 1 toward a channel, a concentration is gradually reduced in order of the third, second and first source/drain regions 38, 37 and 7. Therefore, an electric field is relieved in the gate terminal region. Moreover, the second and third source/drain regions 37 and 38 are formed deeply in the semiconductor substrate 1. With the structure shown in FIG. 22, therefore, a depletion layer spreads more easily from the pn junction interface of the source/drain region than in the structure shown in FIG. 20. Consequently, a relaxation of the electric field can be promoted. On the contrary, the second source/drain region 37 shown in FIG. 22 is formed deeply from the surface of the semiconductor substrate 1. Therefore, there is a drawback that a substrate punch-through is caused more easily than in the structure shown in FIG. 20.

Figure 23:
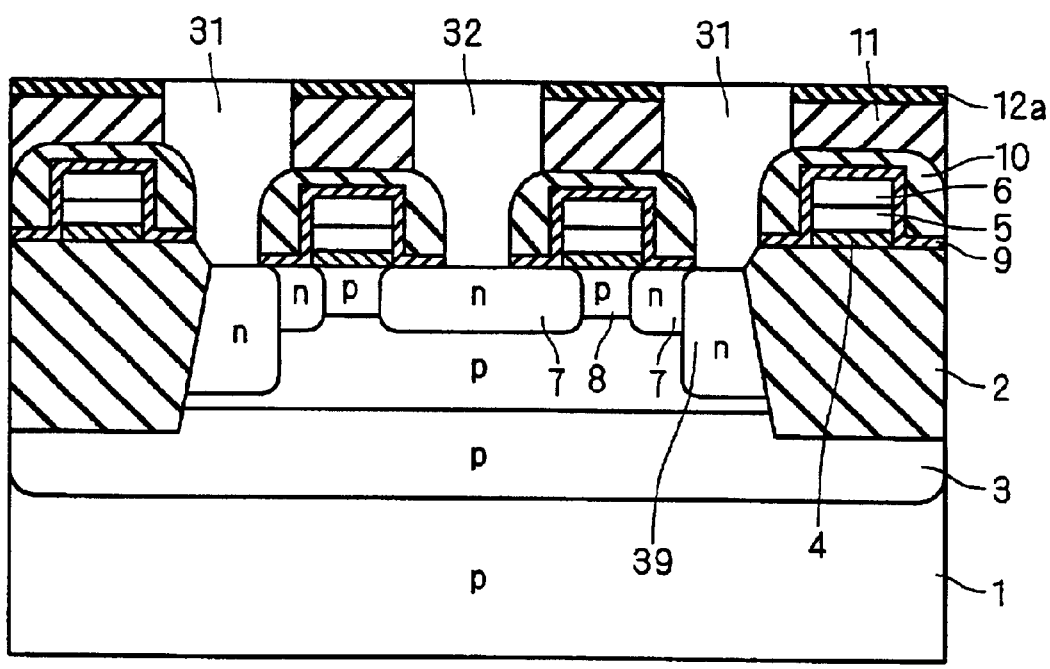
FIG. 23 is a sectional view showing a memory cell region in which the source/drain region is asymmetrical.

The source/drain structure of a conventional memory cell transistor has had an asymmetrical distribution in order to cause the substrate punch through with difficulty as shown in FIG. 23, for example. The second source/drain region 39 is formed on only the side to be connected to the storage node (a vicinal region provided under the trench 31). With this structure, a resistance of the source/drain region on the side (a vicinal region provided under the trench 32) to be connected to a bit line is high. For this reason, there is a problem in that a current value is reduced during writing.

Moreover, the second source/drain region 39 is formed on only the storage-node side. Therefore, the structures on the bit-line side and the storage-node side are separately formed by mask patterning. Consequently, there is a problem in that a mask and a transfer step are increased.

On the other hand, with the structures shown in FIGS. 20 and 22 which are obtained by the method for forming the second and third source/drain regions according to the first embodiment of the present invention, the second and third source/drain regions are also formed deeply in the substrate over the source/drain region on the bit-line side. Therefore, there is an advantage that a resistance of the whole source/drain region is reduced and a magnitude of a writing current is increased.

Moreover, since the structures on the bit-line side and the storage-node side are symmetrical with each other, they can be formed at the same time. Furthermore, there is an advantage that a mask and a transfer step which are necessary for forming the structure of FIG. 23 can be omitted.

Figure 25:
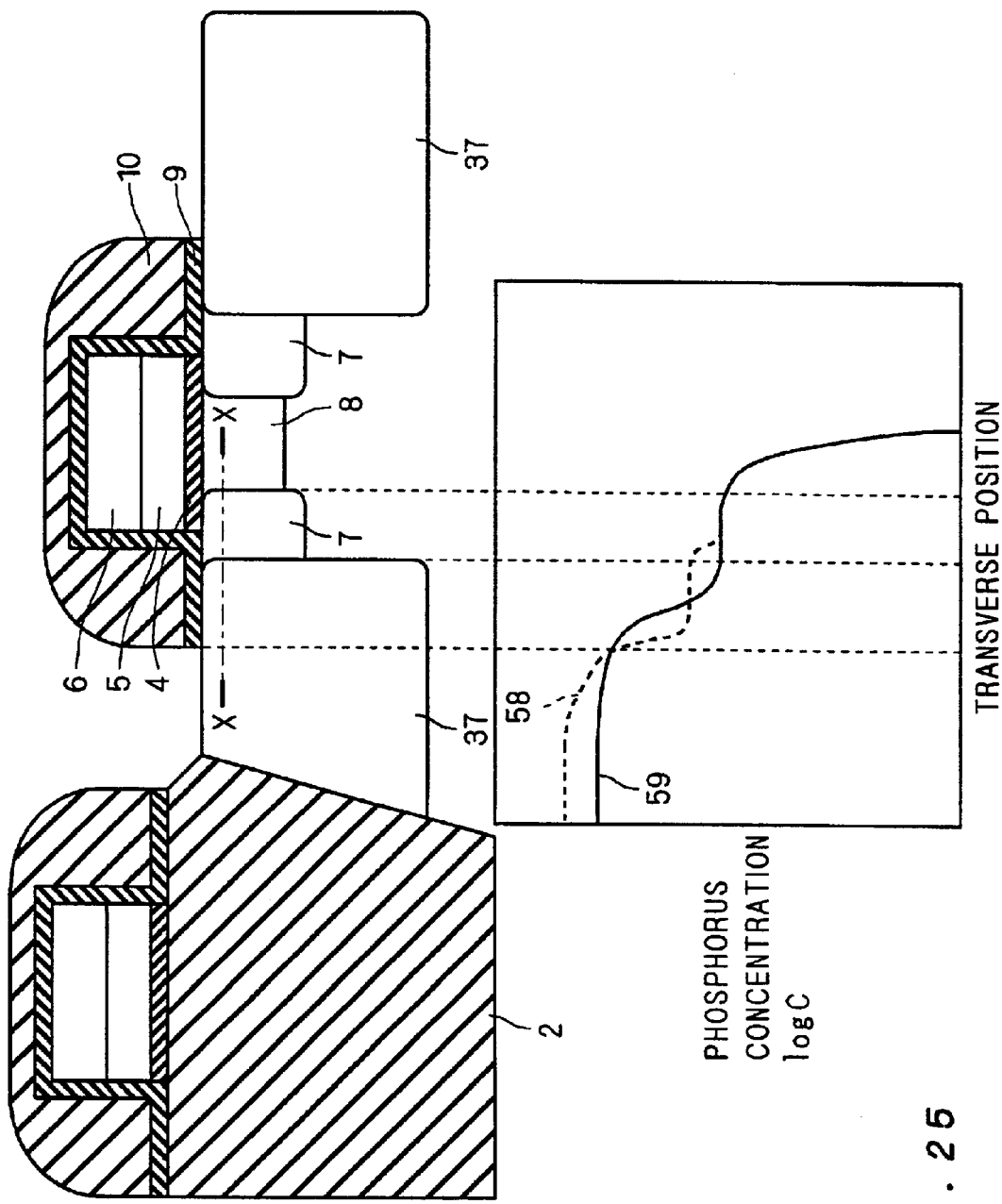
FIG. 25 is a chart showing a change in a concentration in the source/drain region on a storage-node side.

FIG. 25 is a chart showing a change in a concentration in a transverse direction of the source/drain region on the storage-node side. FIG. 25 shows a change in a phosphorus concentration C (logarithmic value) of each of the source/drain regions 7 and 37 on the X—X line. As shown in FIG. 25, the structure shown in FIG. 22 has an advantage of relieving the electric field of the gate terminal region still more because a change 59 in the concentration of the source/drain region on the storage-node side is varied more gradually toward the channel side than a change 58 in the concentration of the structure shown in FIG. 23.

It is apparent that the electric field can be more relieved by a formation width of the sidewall 34 acting as the second sidewall than in the conventional structure.

Moreover, the second and third source/drain regions can be formed by using plasma doping and cluster ion beams in addition to the ion implantation.

Layout Structure

Figure 24:
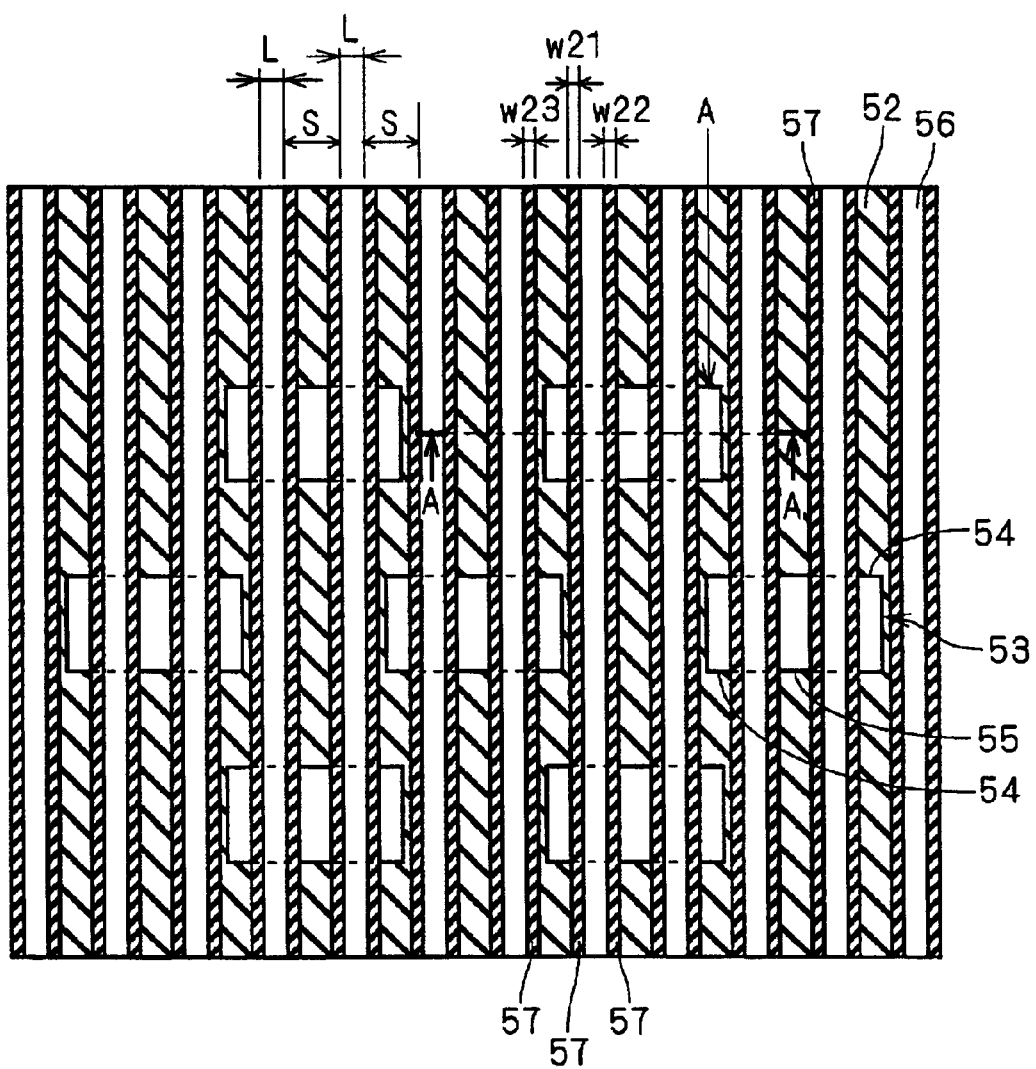
FIG. 24 is a plan view showing a layout structure of the memory cell region according to the first embodiment.

Next, a layout structure of a DRAM manufactured by the method for manufacturing a DRAM according to the first embodiment will be described. FIG. 24 is a plan view showing a layout structure of a memory cell region MA according to the first embodiment. Layouts of a bit line, a capacitor element and the like are omitted.

In FIG. 24, an active region 53 is selectively formed in a region isolated by an element isolation region STI 52. A part of the active region 53 functions as a source/drain region 54 on the capacitor element side, and the other part functions as a source/drain region 55 on the bit-line side. A word line (a gate-electrode) 56 is provided by vertically dividing the source/drain regions 54 and 55, and a sidewall 57 is formed on both sides of the word line 56.

The sectional views of the memory cell region MA typically shown in FIGS. 1, 3, 5, 7, 11, 13 and 15 correspond to an A—A section of FIG. 24. For example, referring to a relationship between FIGS. 24 and 1, the STI 52, the source/drain regions 54 and 55, the word line 56 and the sidewall 57 are equivalent to the STI 2, the source/drain region 7, the gate-electrodes 5 and 6, and the sidewall 10, respectively.

Taking note of a memory transistor (MOS transistor) A of the memory cell shown in FIG. 24, sidewall widths w21 and w22 on both sides of a memory cell transistor are equal to each other (both w21 and w22 correspond to the sidewall width 27a in FIG. 1). Moreover, a sidewall width w23 of the adjacent word line 56 (functioning as a gate-electrode in another region) is also equal to the sidewall widths w21 and w22. A line and space of a word line has a repetitive pattern of L and S in FIG. 24.

Second Embodiment

Principle

A MOS transistor manufactured by a method for manufacturing a DRAM according to a second embodiment of the present invention which will be described below is characterized in that a sidewall width of a DRAM memory cell NMOS is greater on a capacitor-element side than on a bit-line side.

As described above, a value obtained by dividing an electric potential difference between a capacitor element and a gate-electrode of a cell transistor during pause refresh by a sidewall width approximates to an electric-field strength at the edge of a gate-electrode terminal. Accordingly, as the sidewall width is more increased, an electric-field strength in a gate terminal region is more reduced. When the electric-field strength in this region is reduced, a leakage current generated by TAT (Trap Assisted Tunneling) is decreased. Consequently, a pause-refresh time is prolonged. The DRAM manufactured according to the second embodiment of the present invention can realize a long pause-refresh time.

Moreover, the sidewall of the memory cell transistor manufactured by the method for manufacturing a DRAM according to the first embodiment is laterally symmetrical and has a great sidewall width. Therefore, there is a problem in that a cell area is increased to keep a contact diameter for connecting a source/drain region of the transistor with a bit line or a capacitor element. On the other hand, in the method for manufacturing a DRAM according to the second embodiment which will be described below, it is possible to implement a DRAM in which sidewall widths are laterally asymmetrical and the pause-refresh time is prolonged without increasing the cell area.

Structure

Figure 26:
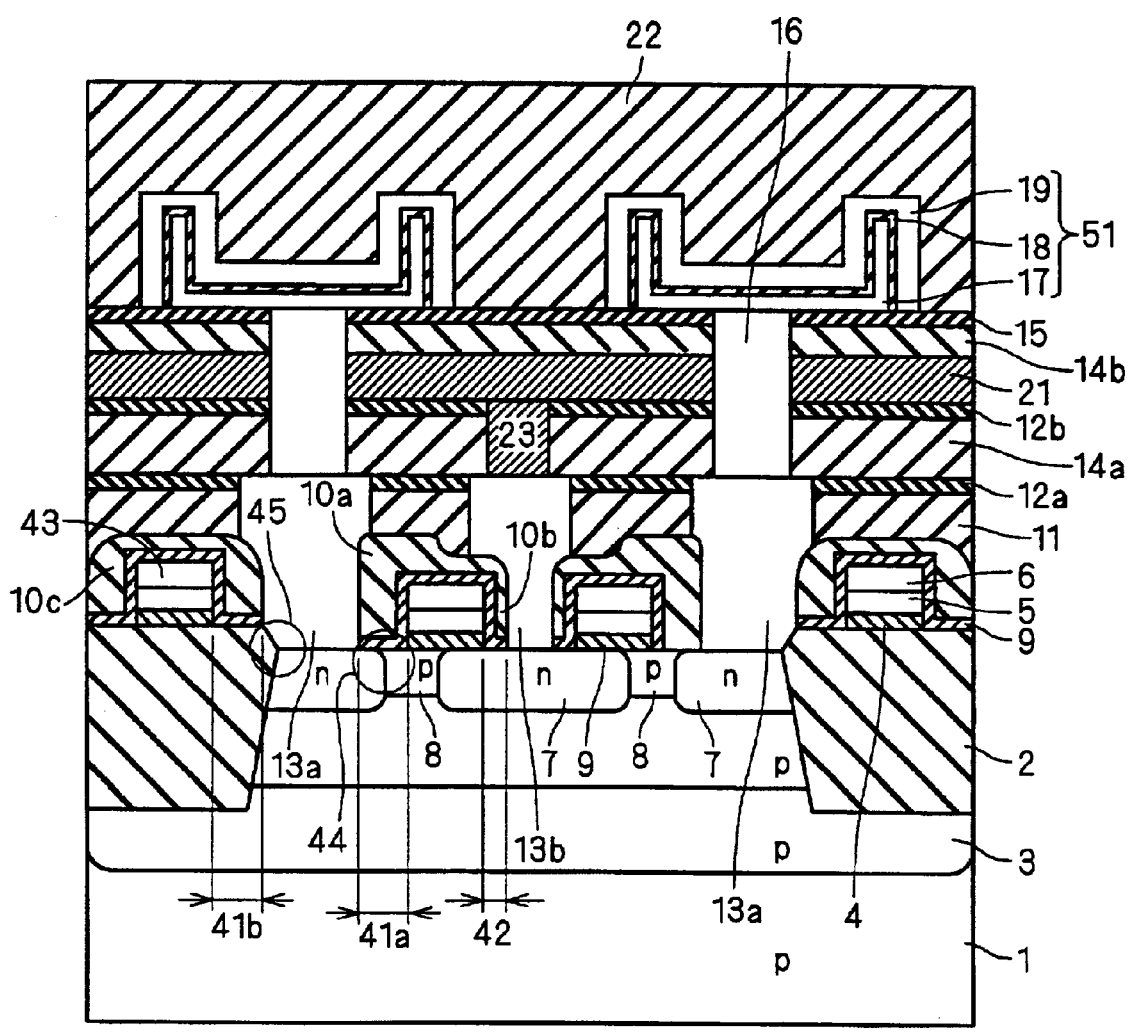
FIG. 26 is a sectional view showing a memory cell region MA of a DRAM manufactured by a method for manufacturing a DRAM according to a second embodiment of the present invention.

FIG. 26 is a sectional view showing a memory cell region MA of a DRAM manufactured by the method for manufacturing a DRAM according to the second embodiment of the present invention. The same portions as those in FIG. 1 have the same reference numerals and their description will properly be omitted.

A structure shown in FIG. 26 is characterized in that a sidewall of a transistor is asymmetrical by a sidewall 10a formed on one side-face and a sidewall 10b formed on the other side-face. A sidewall width 41a of the sidewall 10a on the storage-node side is greater than a sidewall width 42 of the sidewall 10b on the bit-line side. Moreover, it is characterized in that a sidewall width 41b of a sidewall 10c of an adjacent word line 43 is also greater than the sidewall width 42 and is almost equal to the sidewall width 41a.

It is assumed that 2V, 0V, −1V and 1V are applied to the capacitor element, the gate-electrode 6 and the word line 43, a semiconductor substrate 1, and a bit line 21 respectively during a pause, for example. A sidewall of a transistor of a conventional memory cell is laterally symmetrical and has a width of 50 nm. In that case, the electric-field strength of the gate terminal region is $4 \times 10^5$ V/cm by the above-mentioned equation (I).

On the other hand, if the sidewall width 41a on the capacitor-element side is 80 nm and the sidewall width 42 on the bit-line side is 20 nm in the transistor of the memory cell according to the second embodiment, the electric-field strength of the gate terminal region is set to $2.5 \times 10^5$ V/cm by the equation (I).

The sum of the right and left sidewall widths is 50 nm+50 nm=100 nm in the conventional memory cell and the sum is 80 nm+20 nm=100 nm in the memory cell of the DRAM according to the second embodiment. In the memory cell according to the second embodiment, therefore, the same cell area as the area of the conventional memory cell can be kept and the electric-field strength of the gate terminal region 44 can be reduced. Accordingly, a leakage current generated by TAT and BTBT can be reduced so that a pause-refresh time can be prolonged.

Moreover, an electric potential difference between the adjacent word line 43 and a capacitor element 51 which is obtained during a pause is 2 V. Accordingly, if the sidewall width 41b of the sidewall 10c is more increased by the equation (I), the electric-field of a trench end region 45 is more reduced. A leakage current generated by the TAT in the trench end region 45 also causes a deterioration in pause refresh. Therefore, it is also necessary to reduce an electric-field strength in the trench end region 45. According to the memory cell in accordance with the second embodiment, therefore, the electric-field strength in the trench end region 45 is more reduced and a pause-refresh time is made longer than in the conventional memory cell.

Manufacturing Method

FIGS. 27 to 30 are sectional views showing the method for manufacturing a DRAM according to the second embodiment of the present invention. Differently from the manufacturing method according to the first embodiment, the manufacturing method according to the second embodiment is characterized by a step of forming a sidewall of a memory cell transistor. Therefore, only the step of forming a sidewall of a memory cell transistor will be described below. Since other steps are the same as in the conventional method, their description will be omitted.

Figure 5:
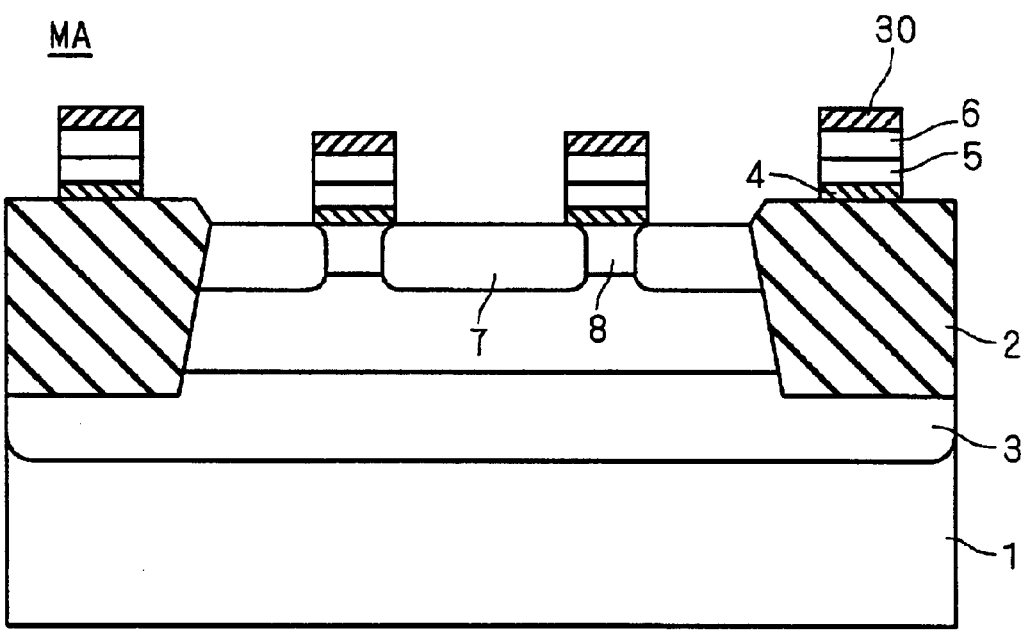
FIG. 5 is a sectional view showing the method for manufacturing a DRAM (memory cell region) according to the first embodiment.
Figure 6:
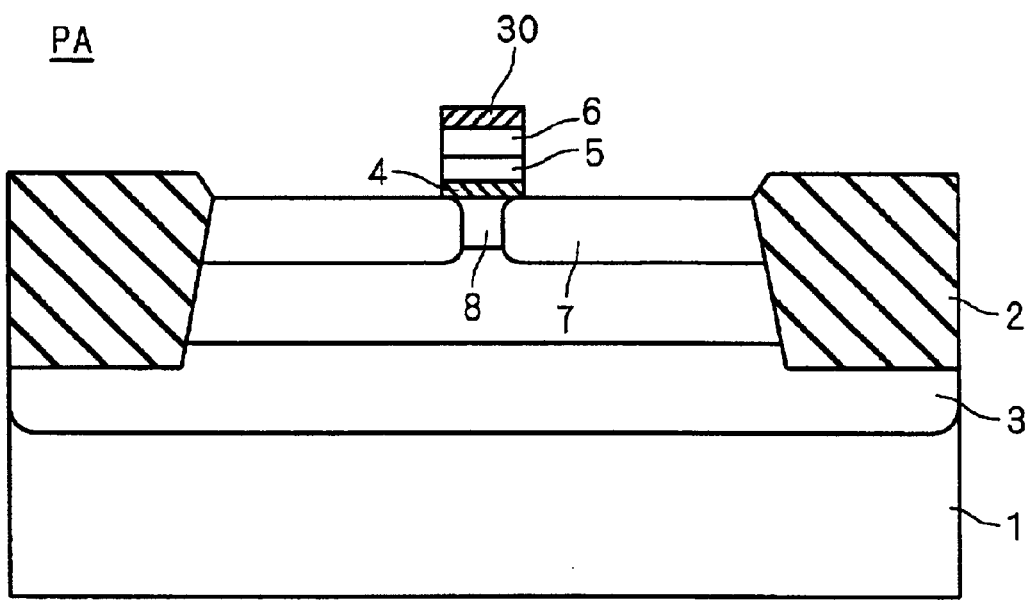
FIG. 6 is a sectional view showing the method for manufacturing a DRAM (peripheral circuit region) according to the first embodiment.
Figure 27:
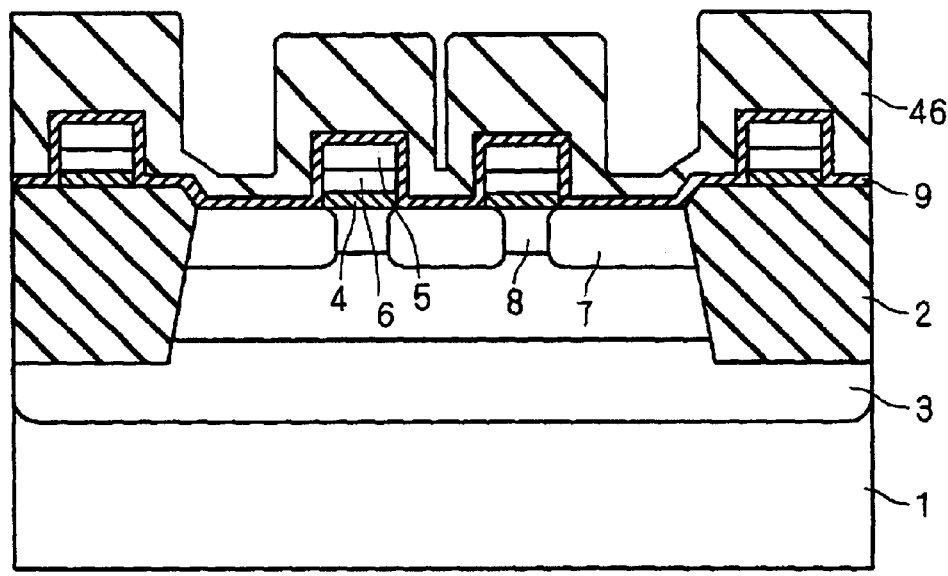
FIGS. 27 to 30 are sectional views showing the method for manufacturing a DRAM according to the second embodiment of the present invention.

First of all, for example, the steps shown in FIGS. 3 to 6 according to the first embodiment are executed to obtain the structures shown in FIGS. 5 and 6 (to form a gate-electrode). Then, an insulating film 9 is formed over the whole surface as shown in FIG. 27. Thereafter, a silicon nitride film 46 is deposited in a thickness of 80 nm, for example.

Figure 28:
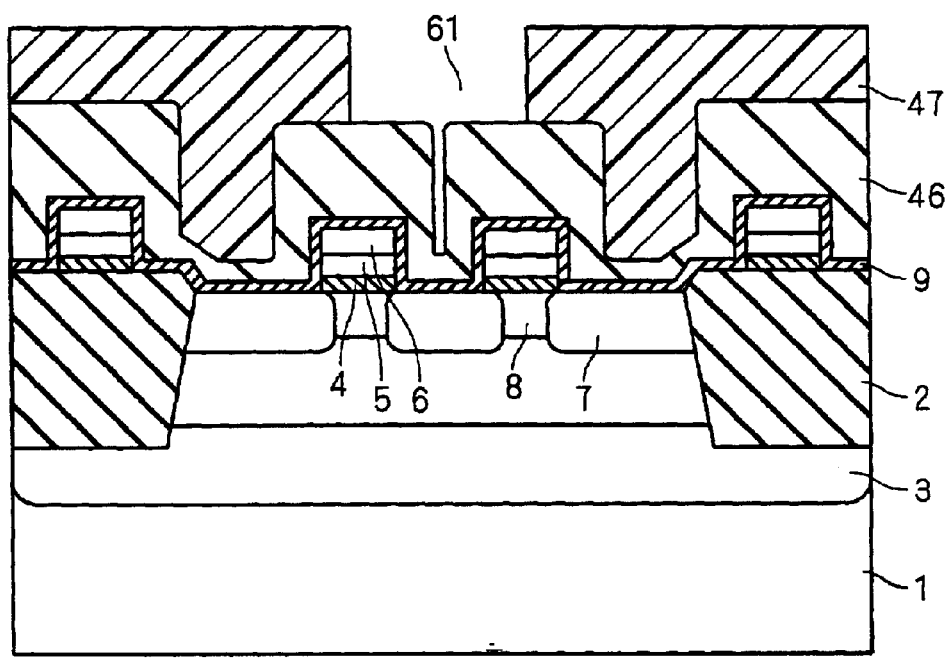

As shown in FIG. 28, next, a resist 47 is applied, and an opening 61 is provided in a region to be connected to a bit line. Then, mask patterning is carried out such that the silicon nitride film 46 is selectively exposed.

Figure 29:
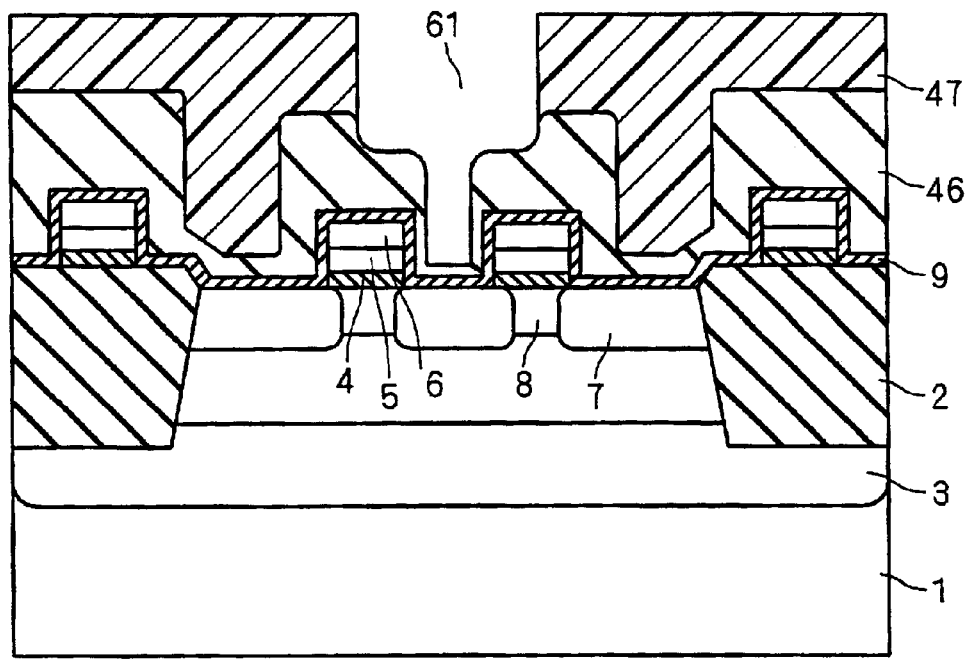

As shown in FIG. 29, subsequently, the silicon nitride film 46 is subjected to isotropic etching for removal by a thickness of 60 nm by using the resist 47 as a mask. As a method for the etching, reactive ion etching or wet etching may be used. Corresponding to the etching at this step, a formation width of side-faces of the gate-electrodes 5 and 6 of the silicon nitride film 46 on the bit-line side (below the opening 61) of the memory cell transistor becomes smaller than that of the side-faces of the gate-electrodes 5 and 6 of another silicon nitride film 46 including the capacitor-element side. In this case, a part of the silicon nitride film 46 remains over the whole surface. Therefore, the insulating film 9 of the semiconductor substrate 1 is not exposed.

Figure 30:
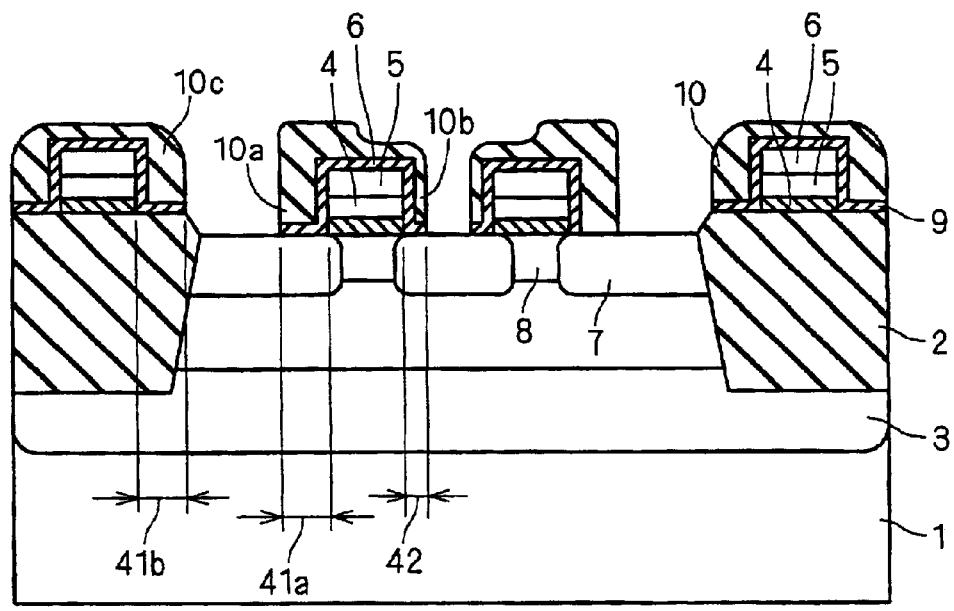

As shown in FIG. 30, next, the resist 47 is removed and the silicon nitride film 46 is then subjected to reactive ion etching to form a sidewall. Consequently, a sidewall width 41a of a sidewall 10a on the capacitor-element side is 80 nm and a sidewall width 42 of a sidewall 10b on the bit-line side is about 20 nm. Moreover, a sidewall width 41b of a sidewall 10c in a portion to be a word line 43 is 80 nm which is equal to the sidewall width 41a.

Figure 31:
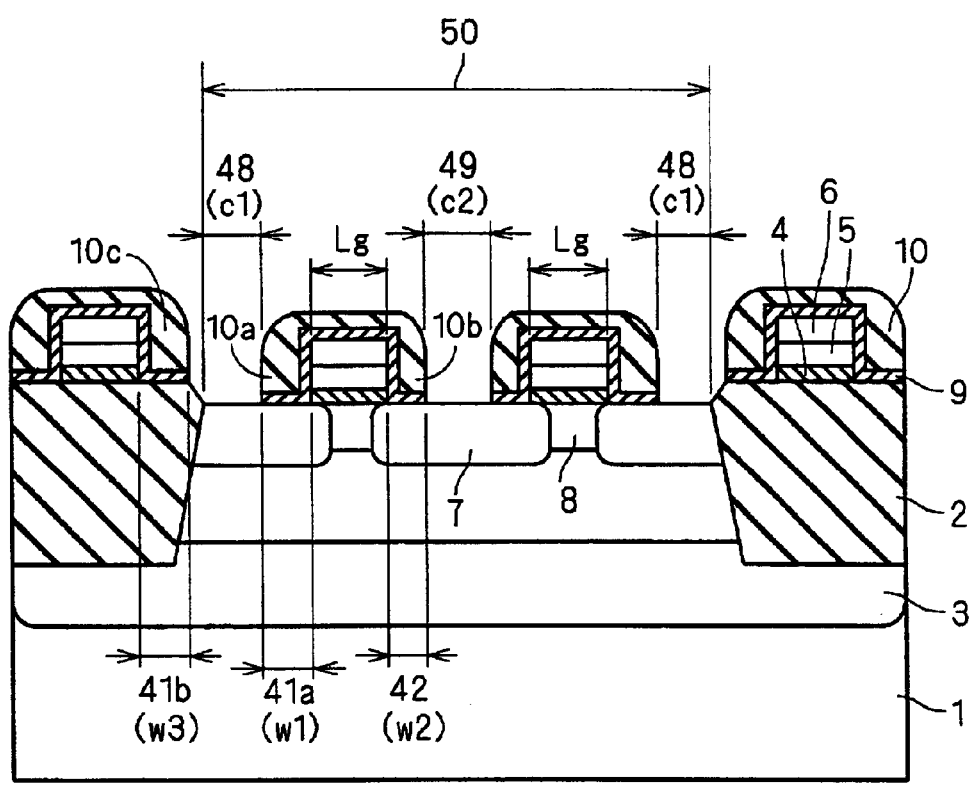
FIG. 31 is a sectional view illustrating each index of Table 1.

Comparative examples of a cell according to the prior art and a cell according to the second embodiment are collected in Table 1. It is apparent from the Table 1 that the cell according to the second embodiment has the same size and contact diameter as in the conventional memory cell. FIG. 31 is a sectional view illustrating each index of the Table 1.

TABLE 1

| | Lg | w1 | w2 | c1 | c2 | Length of Memory cell |
|---|---|---|---|---|---|---|
| Conventional Memory cell | 0.15 μm | 0.05 μm | 0.05 μm | 0.1 μm | 0.12 μm | 0.82 μm |
| Memory cell of Second Embodiment | 0.15 μm | 0.08 μm | 0.02 μm | 0.1 μm | 0.12 μm | 0.82 μm |
| Memory cell of First Embodiment | 0.15 μm | 0.08 μm | 0.08 μm | 0.1 μm | 0.12 μm | 0.94 μm |

In the Table 1, Lg represents a gate length of the memory cell transistor, w1 represents the sidewall width 41a of the sidewall 10a, w2 represents the sidewall width 42 of the sidewall 10b, c1 represents a contact hole diameter 48 on the capacitor-element side, c2 represents a contact hole diameter 49 on the bit-line side, and the memory cell has a length of 50 (=2·c1+c2+2·w1+2·w2+2·Lg) in FIG. 31.

On the other hand, if it is assumed that the memory cell has the same contact diameter as in the first embodiment and the same sidewall width as in the second embodiment, the memory cell has a great length, resulting in an increase in the size of the memory cell. In this respect, the second embodiment is more advantageous than the first embodiment.

In the method for manufacturing a DRAM according to the second embodiment of the present invention, anisotropic etching for exposing a surface of the semiconductor substrate is carried out only once (the reactive ion etching step shown in FIG. 30). In the manufacturing method according to the second embodiment, therefore, a trap density to be introduced into the semiconductor substrate during the anisotropic etching is smaller than in the manufacturing method in which the anisotropic etching is carried out twice or more. Consequently, a leakage current is more reduced.

Layout Structure

Figure 32:
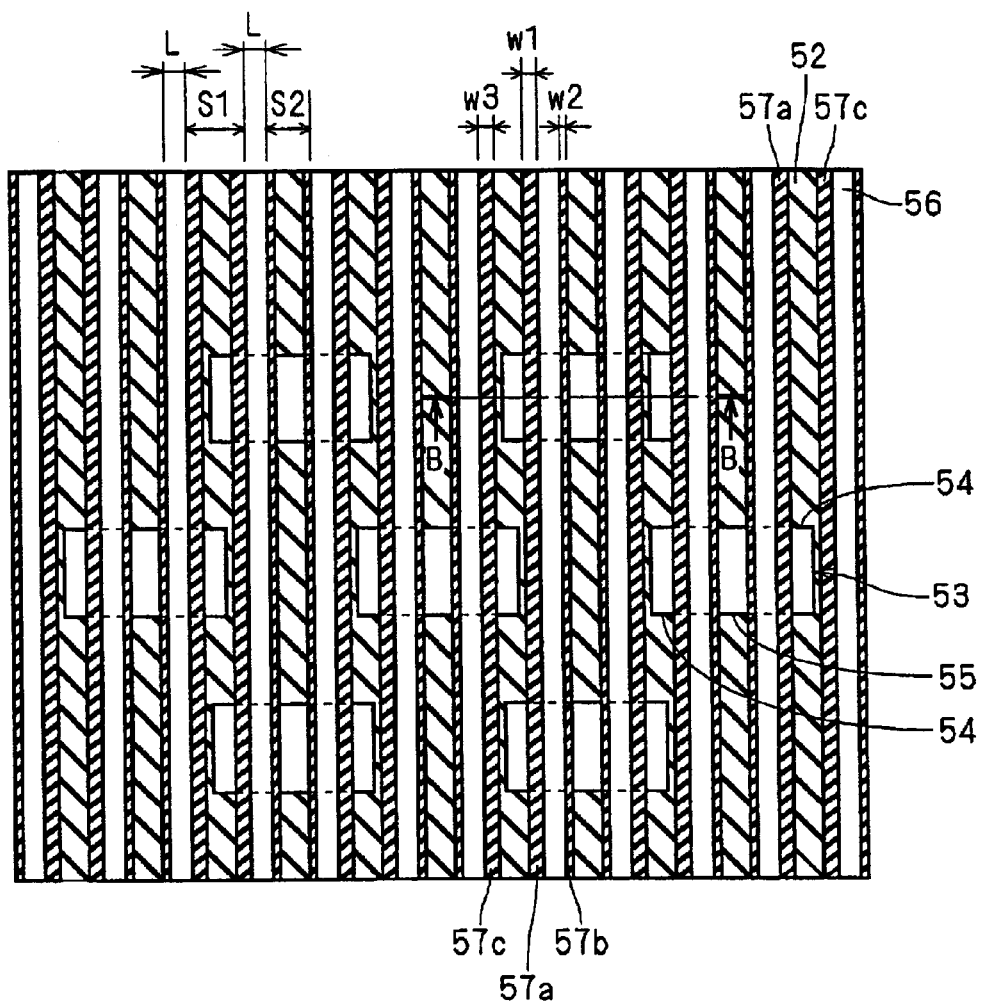
FIG. 32 is a plan view showing a layout structure of a memory cell region according to the second embodiment.

Next, a layout structure of a DRAM manufactured by the method for manufacturing a DRAM according to the second embodiment will be described. FIG. 32 is a plan view showing a layout structure of a memory cell region MA according to the second embodiment. The same portions as those in FIG. 24 have the same reference numerals and their description will properly be omitted. As a formation width of a sidewall, sidewalls 57a and 57c having great formation widths and a sidewall 57b having a small formation width are mixed.

The sectional views of the memory cell region MA typically shown in FIGS. 26 to 30 correspond to a B—B section in FIG. 32. Referring to a relationship between FIG. 32 and FIG. 26, for example, a STI 52, source/drain regions 54 and 55, a word line 56 and sidewalls 57a, 57b and 57c correspond to the STI 2, the source/drain region 7, the gate-electrodes 5 and 6 and the sidewalls 10a, 10b and 10c, respectively. While the sidewall 57b has been shown by a straight line having a formation width w2 in FIG. 32, only a region adjacent to the active region 53 can have the formation width w2 and other regions can have the formation width w2(=w3).

Taking note of a memory transistor B of the memory cell, a sidewall width w1 of the sidewall 57a on the capacitor-element side and a sidewall width w2 of the sidewall 57b on the bit-line side have a relationship of w1>w2. Moreover, a sidewall width w3 of the sidewall 57c of the adjacent word line is equal to the sidewall width w1. A line and space of the word line 56 has a repetitive pattern of L, S1, L and S2 in the drawing.

Figure 33:
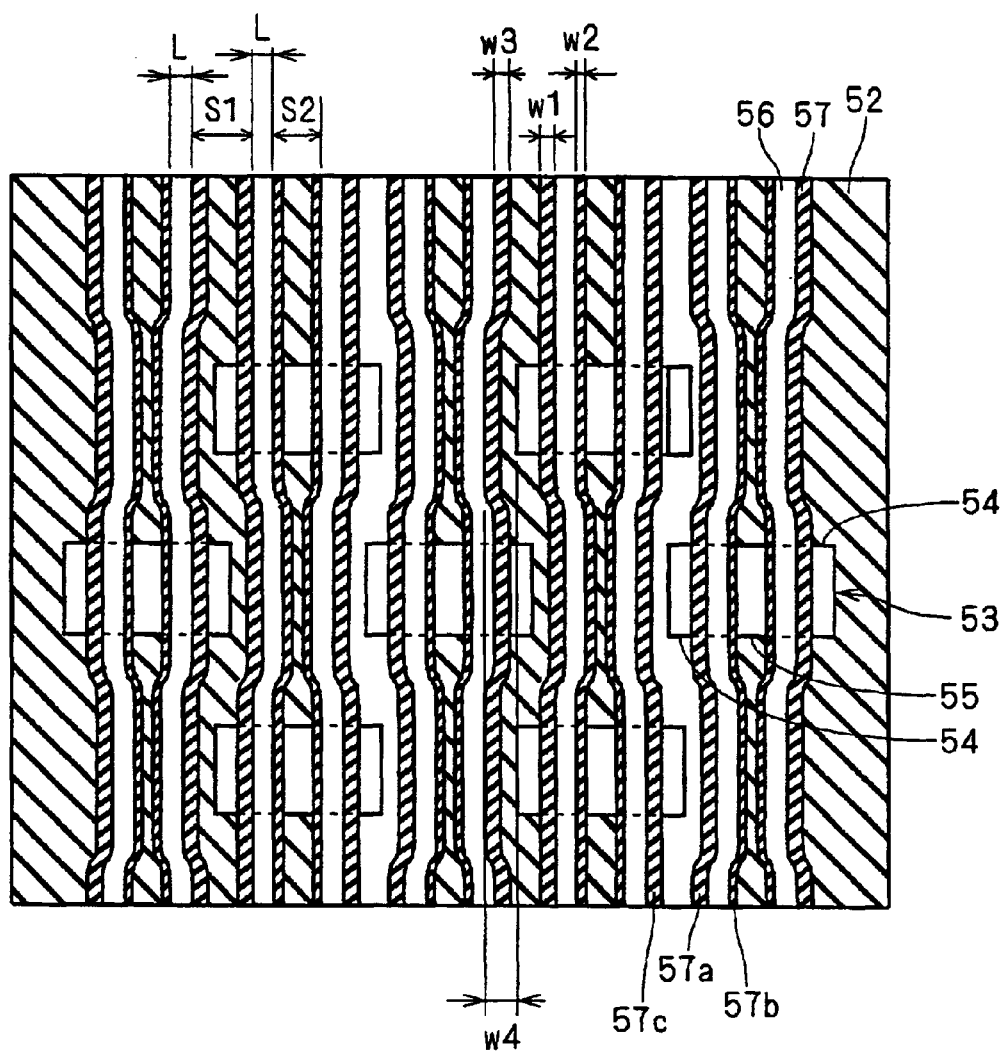
FIG. 33 is a plan view showing another layout structure of the memory cell region according to the second embodiment.
Figure 3:
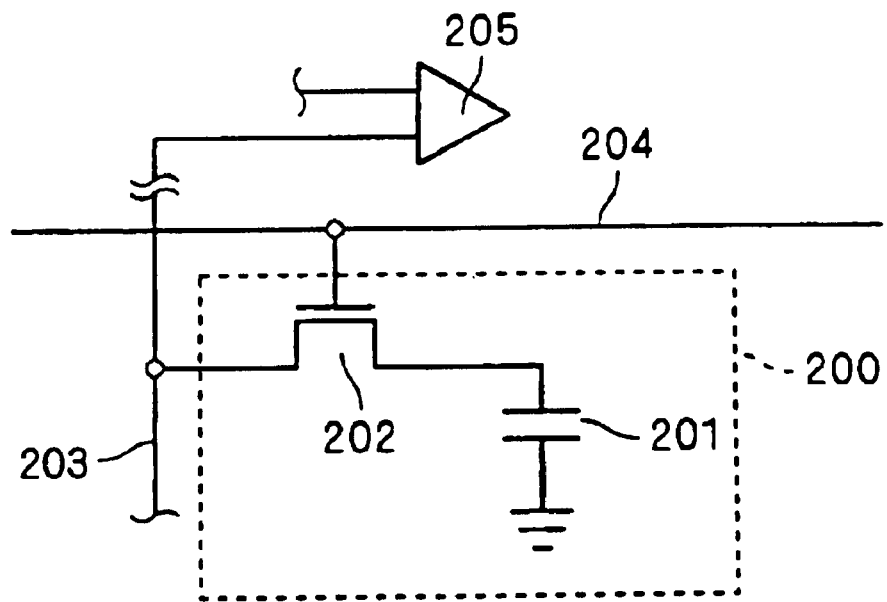
Figure 35:
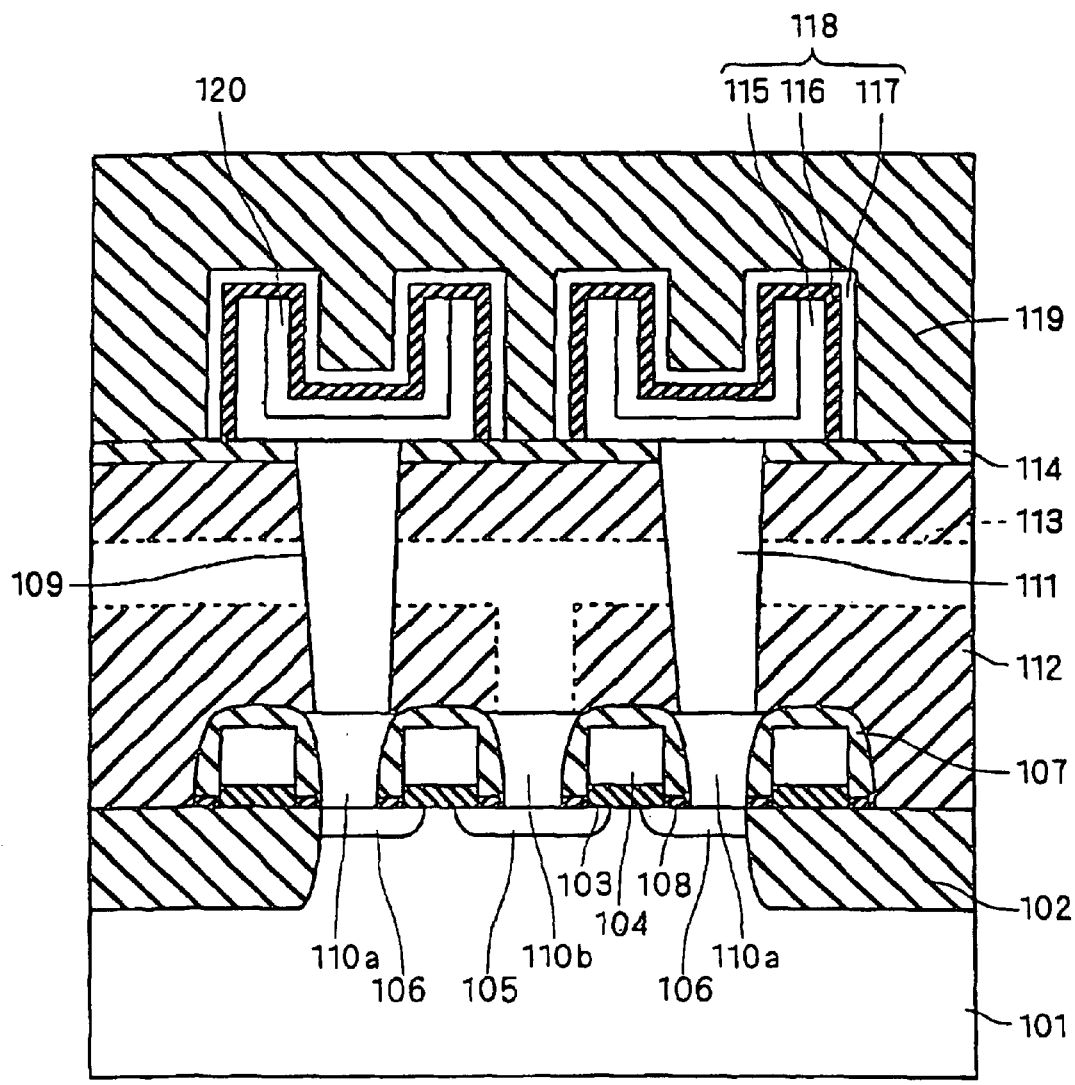
FIG. 35 is a sectional view showing a structure of a memory cell according to the prior art.

FIG. 33 is a plan view showing another layout structure of the memory cell region MA according to the second embodiment. The same portions as those in FIG. 24 have the same reference numerals and their description will properly be omitted.

This layout is characterized in that a width of the STI 52 is changed or a wiring for bending the STI 52, the word line 56 and the sidewall 57, that is, a so-called zigzag wiring is provided to make a distance w4 from the adjacent word line 57 to the source/drain region 53 on the capacitor-element side which is greater than w3. Although the sidewall 57b has had a uniform shape with the formation width w2 in FIG. 33, only a region adjacent to the active region 53 is actually formed with the formation width w2 and other regions are formed with the formation width w2(=w3).

Consequently, a distribution of an electric-field strength on a trench end can be relieved. If necessary, the active region 53 can also be enlarged such that w4 is equal to w3.

Others

The manufacturing methods described above in the first and second embodiments can also be applied to a memory cell such as an SRAM, a flash EEPROM or the like as well as the memory cell of the DRAM, and can control various currents caused by the electric-field strength by regulating the sidewall width of the MOS transistor. Furthermore, an area of the memory cell can also be reduced.

Moreover, even if the above-mentioned first and second embodiments are applied to only auxiliary portions such as a saving circuit of a chip, a saving memory cell and the like, a chip can surely be saved without greatly changing a chip size.

While the invention has been described in detail, the foregoing description is in all aspects illustrative and not restrictive. It is understood that numerous other modifications and variations can be devised without departing from the scope of the invention.

What is claimed is:

1. A method for manufacturing a semiconductor device in which a MOS transistor of a second conductivity type is formed on a semiconductor substrate of a first conductivity type, comprising the steps of:

(a) forming a source/drain region pair of the second conductivity type, a channel region of the first conductivity type which is positioned in said source/drain region pair, and a gate-electrode region positioned on said channel region over a surface of said semiconductor substrate;

(b) forming an insulating film for a sidewall over a whole surface;

(c) partially removing said insulating film for said sidewall on one side-face side of said gate-electrode region without exposing said semiconductor substrate; and (d) performing an etching treatment on said insulating film for said sidewall to remove said insulating film for said sidewall in portions other than a side-face of said gate-electrode region, thereby forming said sidewall on said side-face of said gate-electrode region by said remaining insulating film for said sidewall, said sidewall having a formation width of the other side-face side greater than a formation width of said one side-face side, wherein said MOS transistor comprises said sidewall, said source/drain region pair, said channel region and said gate-electrode region.

2. The method for manufacturing a semiconductor device according to claim 1, further comprising the step of:

(e) forming a memory cell capacitor on said semiconductor substrate after said step (d), one electrode of said memory cell capacitor being electrically connected to a source/drain region on said one side-face side of said source/drain region pair of said MOS transistor.

3. The method for manufacturing a semiconductor device according to claim 2, wherein said semiconductor device includes a DRAM.

* * * * *